(12) United States Patent (10) Patent No.: US 12,567,836 B2

Joshi (45) Date of Patent: Mar. 3, 2026

(54) METHODS FOR MANUFACTURING DOHERTY POWER AMPLIFIER

(71) Applicant: Angelic Drones Inc., Chicago, IL (US)

(72) Inventor: Rachit Joshi, Uttar Pradesh (IN)

(73) Assignee: Angelic Drones Inc., Chicago, IL (US)

( * ) Notice: Subject to any disclaimer, the term of this patent is extended or adjusted under 35 U.S.C. 154(b) by 449 days.

(21) Appl. No.: 18/120,632

(22) Filed: Mar. 13, 2023

(65) Prior Publication Data

US 2023/0253925 A1     Aug. 10, 2023

Related U.S. Application Data

(63) Continuation-in-part of application No. 17/496,929, filed on Oct. 8, 2021, now Pat. No. 12,166,458.

(51) Int. Cl.
| | |
|---|---|
| *H03F 3/68* | (2006.01) |
| *H03F 1/02* | (2006.01) |
| *H03F 1/56* | (2006.01) |
| *H03F 3/195* | (2006.01) |
| *H03F 3/24* | (2006.01) |
| *H03F 3/21* | (2006.01) |

(52) U.S. Cl.
CPC ........... *H03F 1/0288* (2013.01); *H03F 1/565* (2013.01); *H03F 3/195* (2013.01); *H03F 3/245* (2013.01); *H03F 3/211* (2013.01); *H03F 2200/318* (2013.01); *H03F 2200/451* (2013.01)

(58) Field of Classification Search
CPC ........ H03F 1/0288; H03F 1/565; H03F 3/195;
H03F 3/245; H03F 2200/318; H03F 2200/451; H03F 2200/222; H03F 1/56; H03F 3/211; H03F 3/602; H03F 3/68
See application file for complete search history.

(56) References Cited

U.S. PATENT DOCUMENTS

| | | | | |
|---|---|---|---|---|
| 7,248,110 | B2 * | 7/2007 | Dittmer ..................... | H03F 3/24 |
| | | | | 330/124 R |
| 8,228,123 | B2 * | 7/2012 | Blednov ............... | H03F 1/0288 |
| | | | | 330/307 |
| 8,314,654 | B2 * | 11/2012 | Outaleb ................ | H03F 1/0288 |
| | | | | 330/124 R |
| 10,491,165 | B2 * | 11/2019 | Gaynor ................... | H03F 3/211 |
| 11,463,055 | B2 | 10/2022 | Li et al. | |
| 11,469,711 | B2 | 10/2022 | Samata | |
| 2020/0304074 | A1 | 9/2020 | Jang et al. | |
| 2020/0373892 | A1 | 11/2020 | Kim et al. | |

* cited by examiner

*Primary Examiner* — Khanh V Nguyen

(74) *Attorney, Agent, or Firm* — WPAT, PC

(57) ABSTRACT

The present disclosure provides methods for manufacturing Doherty power amplifiers. The methods include: providing at least one main amplifier operated at a fundamental frequency; providing at least one peaking amplifier connected to the main amplifier in parallel and sharing a common load or a load; and connecting a first hybrid integrated matching circuit between output terminals of the at least one main amplifier and the at least one peaking amplifier. Connecting the first hybrid integrated matching circuit includes connecting a first circuit between the output terminals of the at least one main amplifier and the at least one peaking amplifier. The first circuit contributes as a part of an impedance inverting network of the first hybrid integrated matching circuit of the Doherty power amplifier.

21 Claims, 19 Drawing Sheets

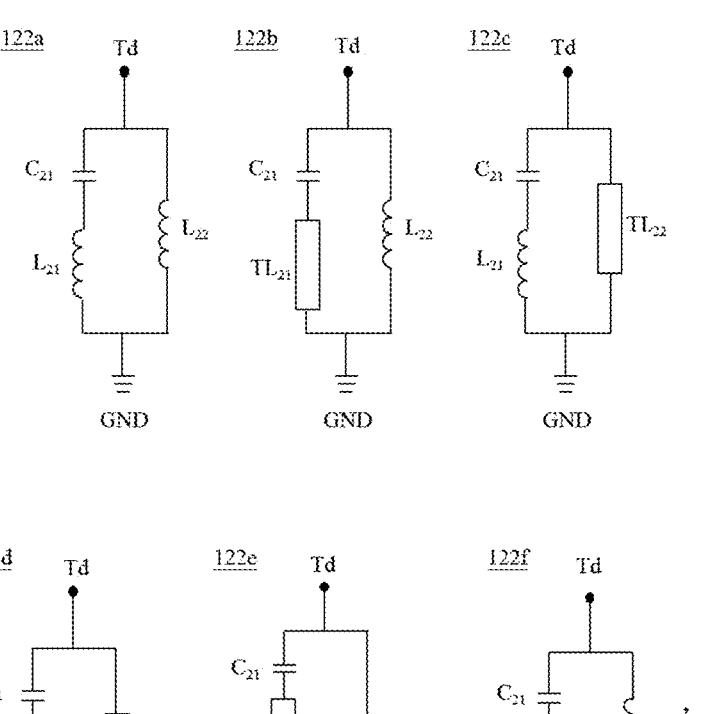
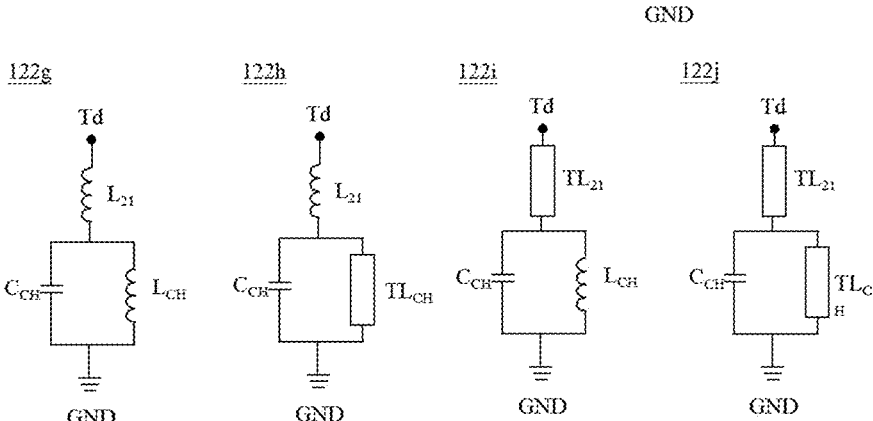
FIG. 3C

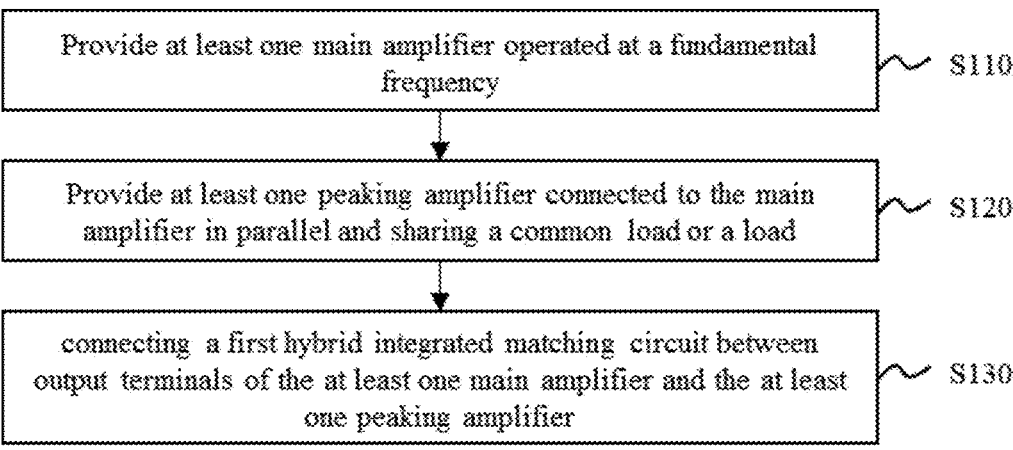

| Provide at least one main amplifier operated at a fundamental frequency | S110 |

| Provide at least one peaking amplifier connected to the main amplifier in parallel and sharing a common load or a load | S120 |

| connecting a first hybrid integrated matching circuit between output terminals of the at least one main amplifier and the at least one peaking amplifier | S130 |

FIG. 6

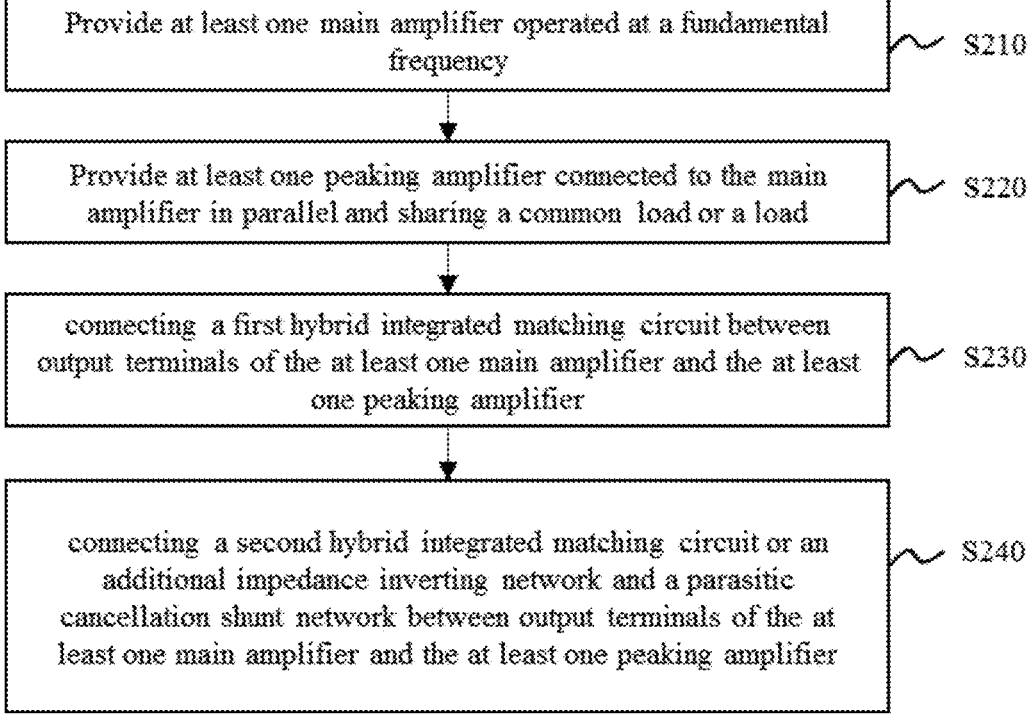

| Provide at least one main amplifier operated at a fundamental frequency | S210 |

| Provide at least one peaking amplifier connected to the main amplifier in parallel and sharing a common load or a load | S220 |

| connecting a first hybrid integrated matching circuit between output terminals of the at least one main amplifier and the at least one peaking amplifier | S230 |

| connecting a second hybrid integrated matching circuit or an additional impedance inverting network and a parasitic cancellation shunt network between output terminals of the at least one main amplifier and the at least one peaking amplifier | S240 |

FIG. 7

METHODS FOR MANUFACTURING DOHERTY POWER AMPLIFIER

CROSS REFERENCE TO RELATED APPLICATION

The application is a continuation-in-part of U.S. application Ser. No. 17/496,929, filed Oct. 8, 2021, and the entire contents of which are incorporated herein by reference.

TECHNICAL FIELD

The disclosed embodiments relate to the features of radio frequency (RF) circuit design and manufacturing method thereof. More particularly, the disclosed embodiments describe various improvements for RF power amplifiers and methods for manufacturing Doherty (e.g. classic or inverted) power amplifiers.

BACKGROUND OF INVENTION

The increasing demand for the high efficiency power amplifier at back off is typically the need for the upcoming 5G MIMO applications. Also, having a high bandwidth is a typical requirement for 5G and other standards for high-speed data transmission for cellular applications. Conventional switch mode Doherty power amplifiers has been quite popular for providing good back off efficiency using harmonic load terminations (class F, $F^{-1}$, etc) but it has a major limitation in terms of bandwidth which comes from using the narrowband quarter wave transmission line.

A lot of ways were developed to address the bandwidth limitation and one approach was using device parasitic compensation. However, it failed to incorporate harmonic load terminations for having a very high efficiency. So, in summary, the currently used Doherty power amplifiers in the industries usually have trade-offs with high efficiency and high bandwidth when it comes to using the parasitic compensation technique. As explained before, while some were able to provide excellent bandwidth using the device parasitic but they could not provide harmonic termination for high efficiency (using switch mode power amplifiers) probably because of difficulty of designing harmonic network and size complications. Similarly, others were able to provide excellent efficiency by using device parasitic for harmonic load terminations (switch mode power amplifiers) but they suffer from bandwidth limitation due to device parasitic while using external quarter wave Transmission line and offset lines which further reduce bandwidth, with bulky size which fails miniaturization and integration purposes.

So, the typical Doherty power amplifier using harmonic matching network employing Switch Mode power amplifier topology using at least two harmonics frequencies, achieve high efficiency but with low bandwidth (narrowband design) and bulky size. Such design is not practical for Monolithic Microwave Integrated Circuits (MMIC) or Hybrid Integrated Circuits (IC) applications due to the large size required by using the harmonic termination network, offset lines and fundamental matching network required for both main and peaking amplifier. So, there is a need for a new type of Doherty power amplifier which can achieve high efficiency using at least two harmonic load terminations, without making the circuit complex and bulky, and providing sufficiently high bandwidth for Monolithic microwave Integrated Circuits (MMIC), hybrid IC or even for discrete RF applications. The present invention attempts to provides the said novel Doherty power amplifier by using novel connecting network called hybrid Integrated Matching Circuits, to be incorporated in industries for all sort of RF applications. Although the present invention focusses on application of hybrid Integrated Matching Circuit for Doherty power amplifiers but they can also be used for general purpose switch Mode and continuous Mode RF power amplifier such as class F, class $F^{-1}$, class J, class E, continuum class F, continuum class $F^{-1}$, continuum class J, class E and other continuum switch mode RF power amplifiers employing harmonic load terminations.

Therefore, it is also necessary to provide a method for manufacturing the above-mentioned Doherty power amplifier.

SUMMARY

The embodiments provided by the present disclosure solves the narrow bandwidth issues of switch mode RF power amplifiers by using impedance inverting network instead of using fundamental matching network, and also absorbing the device parasitic for load harmonic terminations.

The embodiments provided by the present disclosure also achieves effective circuit miniaturization for switch Mode RF power amplifiers.

The embodiments provided by the present disclosure also solves major problems with the current Doherty power amplifiers used in the industries. The problem like trade-off between high bandwidth and high efficiency. There is also a trade-off between high efficiency and size miniaturization. Present invention resolves this trade off by providing not only very high efficiency at back off but also providing a wide bandwidth at the same time along with size miniaturization.

The embodiments provided by the present disclosure also solves the design complications and size problems which often comes from while trying to realize a proper switch mode Doherty power amplifier using both second and third harmonic load terminations for Switch Mode power amplifier designs.

The embodiments provided by the disclosure also provides methods for manufacturing Doherty power amplifier with the above-mentioned features and characteristics.

The present disclosure provides A radio frequency (RF) power amplifier operated at a fundamental frequency and configured to electrically connect a load, comprising: at least one transistor; and a hybrid integrated matching circuit, electrically connected between a drain electrode of the at least one transistor and the load, wherein the hybrid integrated matching circuit comprises: a first circuit, having a first terminal electrically connected to the drain electrode of the at least one transistor and a second terminal electrically connected to the load; and a second circuit, electrically connected between the drain electrode of the at least one transistor and a RF ground, wherein at the fundamental frequency, the first circuit and an output parasitic component of the at least one transistor operate as an impedance inverter of the RF power amplifier, while the second circuit presents a high impedance path relative to the RF ground at the fundamental frequency, and wherein the second circuit is configured to present an impedance relative to the RF ground such that one of a high impedance and a low impedance is observed from an intrinsic plane of the at least one transistor at a first target harmonic of the fundamental frequency to terminate the first target harmonic. The second circuit can be further configured to present an impedance relative to RF ground such that another one of a high impedance and a low impedance is observed from the intrinsic plane of the at least one transistor at a second target harmonic of the fundamental frequency to terminate the second target harmonic.

In an example, the second circuit is further configured to present an impedance relative to the RF ground such that the other one of the high impedance and the low impedance is observed from the intrinsic plane of the at least one transistor at a second target harmonic of the fundamental frequency to terminate the second target harmonic.

In an example, when the at least one transistor is a single transistor, a harmonic matching network for the single transistor is formed by at least the output parasitic component of the single transistor, the first circuit, and the second circuit; and when the at least one transistor is a plurality of transistors, a harmonic matching network for one of the transistors is formed by at least the output parasitic component of at least one of the transistors, the first circuit, and the second circuit.

In an example, the first target harmonic is the second harmonic of the fundamental frequency, and the second target harmonic is the third harmonic of the fundamental frequency.

In an example, the low impedance is observed from the intrinsic plane of the at least one transistor at the second harmonic of the fundamental frequency, and the high impedance is observed from the intrinsic plane of the at least one transistor at the third harmonic of the fundamental frequency.

In an example, the first circuit includes: a transmission circuit, electrically connected between the first terminal and the second terminal; a first reactance component, electrically connected between one of the first terminal and the second terminal and the RF ground; and a second reactance component, electrically connected between the other one of the first terminal and the second terminal and the RF ground.

In an example, the transmission circuit includes at least one of an inductor and a transmission line.

In an example, the second circuit includes a capacitive component and two inductive components, and wherein the capacitive component is electrically connected to one of the inductive components in parallel and to the other one of the inductive components in series.

In an example, the capacitive component and the inductive components includes: a first capacitive component; a first inductive component, electrically connected to the first capacitive component in series and interposed between the drain electrode of the at least one transistor and the RF ground; and a second inductive component, having one end electrically connected to the drain electrode of the at least one transistor and to the first terminal and the other end electrically connected to RF ground.

In an example, the first capacitive component and the first inductive component are sized to present a low impedance path connecting to the RF ground at the first target harmonic of the fundamental frequency.

In an example, the second inductive component is sized such that the first capacitive component, the first inductive component, and the second inductive component behave as an open circuit relative to RF ground at the fundamental frequency.

In an example, the first capacitive component is a capacitor, each of the first inductive component and the second inductive component is implemented partly or fully by at least one of an inductor and a transmission line, and the capacitor, the inductor, and the transmission line of the second circuit are sized to meet below equation:

$$L_{21}C_{21} = \frac{1}{(n\omega_0)^2};$$

$$L_{22} = \frac{(1 - \omega_0^2 L_{21} C_{21})}{\omega_0^2 C_{21}};$$

$$Z_{21}\tan(\theta_{21}) = \omega_0 L_{21};$$

$$Z_{22}\tan(\theta_{22}) = \omega_0 L_{22};$$

$$Z'_{21}\tan(\theta'_{21}) + \omega_0 L'_{21} = \omega_0 L_{21};$$

$$Z'_{22}\tan(\theta'_{22}) + \omega_0 L'_{22} = \omega_0 L_{21};$$

In the above equation, $C_{21}$ is the capacitance of the capacitor which implements the first capacitive component; $L_{21}$ is the inductance of the inductor which implements the first inductive component; $L_{22}$ is the inductance of the inductor which implements the second inductive component; $Z_{21}$ is the characteristic impedance of the transmission line which implements the first inductive component whose value is $L_{21}$; $Z_{22}$ is the characteristic impedance of the transmission line which implements the second inductive component whose value is $L_{22}$; $\omega_o$ is the fundamental frequency, n is the index for $n^{th}$ harmonic number; $\theta_{21}$ is the electrical angle of the transmission line which implements the first inductive component whose value is $L_{21}$; and $\theta_{22}$ is the electrical angle of the transmission line which implements the second inductive component whose value is $L_{22}$; $Z_{21}'$ and $\theta_{21}'$ are the characteristic impedance and electrical angle of the transmission line which implements an inductive component which work together with inductor $L_{21}'$ to implement the first inductive component $L_{21}$; $Z_{22}'$ and $\theta_{22}'$ are the characteristic impedance and electrical angle of the transmission line which implements an inductive component which work together with inductor $L_{22}'$ to implement the second inductive component $L_{22}$.

In an example, the impedance inverter includes at least one of the following topologies: a low pass $n^{th}$ stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer.

In an example, the capacitive component and the inductive components includes: a first inductive component; and an LC tank, electrically connected to the first inductive component in series and between the drain electrode of the at least one transistor and the RF ground, wherein: the LC tank comprises a second inductive component and a first capacitive component electrically connected in parallel wherein the first inductive component and the second inductive component are configured to present at least one of the second harmonic high impedance, the second harmonic low impedance, and the third harmonic low impedance at the intrinsic plane of the transistor with which the second circuit is connected, wherein the second inductive component and first capacitive component are configured to present a high impedance path relative to the RF ground at fundamental frequency using the following equation:

$$L_{CH}C_{CH} = \frac{1}{(\omega_0)^2};$$

In the above equation, $L_{CH}$ is the inductance of the second inductive component, $C_{CH}$ is the capacitance of the first capacitive component, and $\omega_o$ is the fundamental frequency.

The present disclosure provides a method for manufacturing a Doherty power amplifier, comprising: providing at least one main amplifier operated at a fundamental frequency; providing at least one peaking amplifier connected to the main amplifier in parallel and sharing a common load or a load; connecting a first hybrid integrated matching circuit between output terminals of the at least one main amplifier and the at least one peaking amplifier, wherein connecting the first hybrid integrated matching circuit comprises: connecting a first circuit between the output terminals of the at least one main amplifier and the at least one peaking amplifier, wherein the first circuit contributes as a part of an impedance inverting network of the first hybrid integrated matching circuit of the Doherty power amplifier.

In an example, connecting the first hybrid integrated matching circuit includes determining the size of the components included in the second circuit and the third circuit so as to terminate the other one of the second harmonic and the third harmonic of the fundamental frequency by using at least the first circuit, the second circuit, and the third circuit presenting impedances such that one of a high impedance and a low impedance is observed from the intrinsic plane of the main amplifier and peaking amplifier corresponding to that harmonic frequency.

In an example, the impedance inverting network of the first hybrid integrated matching is constructed with an impedance inverter with at least one of the following topologies: a low pass $n^{th}$ stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer.

In an example, providing the at least one peaking amplifier includes providing at least two peaking amplifiers, and the method further includes: connecting a parasitic cancellation shunt network between the output terminal of each of the at least two peaking amplifiers and the RF ground.

The present disclosure provides another method for manufacturing a Doherty power amplifier, comprising providing at least one main amplifier operated at a fundamental frequency; providing at least one peaking amplifier connected to the main amplifier in parallel and sharing a common load or a load; connecting a first hybrid integrated matching circuit between output terminals of the at least one main amplifier and the at least one peaking amplifier, wherein connecting the first hybrid integrated matching circuit comprises: connecting a first circuit between the output terminals of the at least one main amplifier and the at least one peaking amplifier, wherein the first circuit contributes as a part of an impedance inverting network of the first hybrid integrated matching circuit of the Doherty power amplifier; connecting a second hybrid integrated matching circuit between output terminals of the at least one main amplifier and the at least one peaking amplifier, wherein the first hybrid integrated matching circuit and the second hybrid integrated matching circuit are connected together by an impedance inverting network and sharing the common load, wherein connecting the second hybrid integrated matching circuit comprises: connecting a first circuit between the output terminals of the at least one main amplifier and the at least one peaking amplifier, wherein the first circuit contributes as a part of an impedance inverting network of the second hybrid integrated matching circuit of the Doherty power amplifier.

In an example, the impedance inverting network connecting the first and the second hybrid integrated matching circuit is configured to prevent leakage of signal from between transistors of the at least one main amplifier and the at least one peaking amplifier when any of the transistors is turned off, and wherein a characteristics impedance of the impedance inverting network is adjusted to optimize a bandwidth of the Doherty power amplifier.

In an example, the impedance inverting network connecting the first and the second hybrid integrated matching circuit includes at least one of the following topologies: a quarter wave transformer, a high pass $n^{th}$ order quarter wave transformer, a low pass $n^{th}$ order quarter wave transformer, a low pass $n^{th}$ stage lumped quarter wave transformer, a high pass $n^{th}$ stage lumped quarter wave transformer a reduced length quarter wave transmission line, a quasi-lumped $n^{th}$ order low pass filter, a quasi-lumped $n^{th}$ order high pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, a quasi-lumped $n^{th}$ order high pass quarter wave transformer, a quasi-lumped high pass Chebyshev transformer, a quasi-lumped high pass Chebyshev quarter wave transformer, quasi-lumped high pass quarter wave stepped impedance transformer and a quasi-lumped high pass quarter wave stepped impedance quarter wave transformer, a combination of low pass and high pass lumped or distributed quarter wave transformer.

In an example, the impedance inverting network of the second hybrid integrated matching circuit is constructed with an impedance inverter with at least one of the following topologies: a low pass $n^{th}$ stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer.

In an example, providing the at least one peaking amplifier includes providing at least two peaking amplifiers, and the method further includes: connecting at least one additional hybrid integrated matching circuit between output terminals of the at least two peaking amplifiers such that each of the at least two peaking amplifiers is associated with one hybrid integrated matching circuit, wherein the first hybrid integrated matching circuit, the second hybrid integrated matching circuit and the at least one additional hybrid integrated matching circuit are connected together by the impedance inverting networks and sharing the common load. Connecting the at least one additional hybrid integrated matching circuit includes: connecting a first circuit between the output terminals of the at least two peaking amplifiers, wherein the first circuit contributes as a part of an impedance inverting network of the at least one additional hybrid integrated matching circuit of the Doherty power amplifier.

The present disclosure provides yet another method for manufacturing a Doherty power amplifier, comprising providing a main amplifier operated at a fundamental frequency; providing a first peaking amplifier and a second peaking amplifier connected to the first peaking amplifier in parallel, wherein the first and second peaking amplifiers are connected to the main amplifier in parallel via an impedance inverting network and sharing a common load or a load; connecting a first hybrid integrated matching circuit between output terminals of the main amplifier and the first and second peaking amplifiers, wherein connecting the first hybrid integrated matching circuit comprises: connecting a first circuit between the output terminals of the main amplifier and the first and second peaking amplifiers, wherein the first circuit contributes as a part of an impedance inverting network of the first hybrid integrated matching circuit of the Doherty power amplifier; connecting a second hybrid integrated matching circuit between output terminals of the main amplifier and the first and second peaking amplifiers, wherein the first hybrid integrated matching circuit and the second hybrid integrated matching circuit are connected together by the impedance inverting network and sharing the common load, wherein connecting the second hybrid integrated matching circuit comprises: connecting a first circuit between the output terminals of the main amplifier and the first peaking amplifier, wherein the first circuit contributes as a part of an impedance inverting network of the second hybrid integrated matching circuit of the Doherty power amplifier.

In an example, the method further comprises connecting a third hybrid integrated matching circuit between output terminals of the first peaking amplifier and the second peaking amplifier, wherein the second hybrid integrated matching circuit and the third hybrid integrated matching circuit are connected together by another impedance inverting network and sharing the common load.

In an example, connecting the third hybrid integrated matching circuit comprises: connecting a first circuit between the output terminals of the first peaking amplifier and the second peaking amplifier, wherein the first circuit contributes as a part of an impedance inverting network of the third hybrid integrated matching circuit of the Doherty power amplifier.

In an example, the method further comprises connecting a parasitic cancellation shunt network between output terminals of the first peaking amplifier and the second peaking amplifier and a RF ground.

In an example, the impedance inverting network connecting the first and the second hybrid integrated matching circuit is configured to prevent leakage of signal from between transistors of the main amplifier and the first and second peaking amplifiers when any of the transistors is turned off, and wherein a characteristic impedance of the impedance inverting network is adjusted to optimize a bandwidth and efficiency peaks of the Doherty power amplifier. Furthermore, the another impedance inverting network connecting the second and the third hybrid integrated matching circuit is configured to prevent leakage of signal from between transistors of the first and second peaking amplifiers when any of the transistors is turned off, and wherein a characteristic impedance of the another impedance inverting network is adjusted to optimize a bandwidth of the Doherty power amplifier.

In an example, each of the impedance inverting network connecting the first and the second hybrid integrated matching circuit and the another impedance inverting network connecting the second and the third hybrid integrated matching circuit includes at least one of the following topologies: a quarter wave transformer, a high pass $n^{th}$ order quarter wave transformer, a low pass $n^{th}$ order quarter wave transformer, a low pass $n^{th}$ stage lumped quarter wave transformer, a high pass $n^{th}$ stage lumped quarter wave transformer a reduced length quarter wave transmission line, a quasi-lumped $n^{th}$ order low pass filter, a quasi-lumped $n^{th}$ order high pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, a quasi-lumped $n^{th}$ order high pass quarter wave transformer, a quasi-lumped high pass Chebyshev transformer, a quasi-lumped high pass Chebyshev quarter wave transformer, quasi-lumped high pass quarter wave stepped impedance transformer and a quasi-lumped high pass quarter wave stepped impedance quarter wave transformer, a combination of low pass and high pass lumped or distributed quarter wave transformer.

In an example, each of the impedance inverting network of the second and the third hybrid integrated matching circuits is constructed with an impedance inverter with at least one of the following topologies: a low pass $n^{th}$ stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer.

The present disclosure provides a RF power amplifier operated at a fundamental frequency and configured to electrically connect a load, comprising: at least one transistor; a harmonic termination circuit, having one terminal directly connected to the drain electrode of the at least one transistor and the other end electrically connected to a RF ground, wherein the harmonic termination circuit contributes as a part of a harmonic matching network for the at least one transistor at least one of the second harmonic and the third harmonic of the fundamental frequency; and an impedance inverter, having a first terminal electrically connected to the drain electrode of the at least one transistor and a second terminal electrically connected to the load, and configured to perform impedance inversion of a static load or a modulated load at the fundamental frequency without affected by the harmonic termination circuit.

BRIEF DESCRIPTION OF THE FIGURES

In order to explain more clearly the technical solution in the present embodiment, the following is a brief introduction of the drawings described in the embodiments. Obviously, the drawings described below are only some embodiments of the present application. For the person having ordinary skill in the art, other drawings can be obtained from these drawings without any creative effort.

FIGS. 3A-3C are schematic circuit diagrams of a RF power amplifier having a hybrid integrated matching circuit according to some exemplary embodiments of FIG. 1B;

FIG. 6 is a flow chart of a method for manufacturing a Doherty power amplifier.

FIG. 7 is a flow chart of another method for manufacturing a Doherty power amplifier.

DETAILED DESCRIPTION OF EMBODIMENTS

Figure 1A:
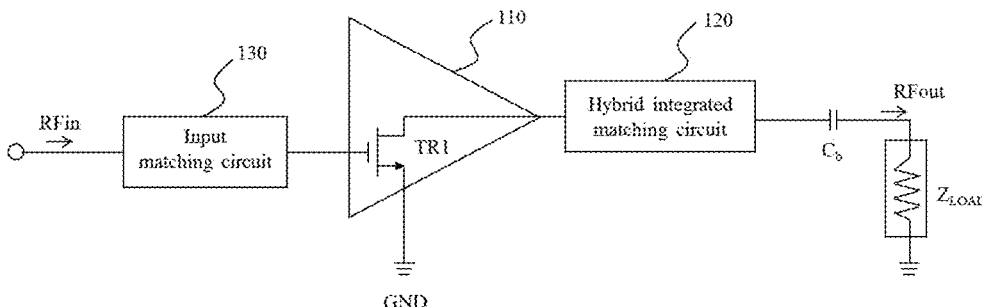
FIG. 1A is a block diagram of a RF power amplifier according to some exemplary embodiments of the present disclosure.

The present disclosure provides a novel RF power amplifier and methods for manufacturing Doherty (e.g. classic or inverted) power amplifiers. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, or circuits, these elements, components, and/or circuits should not be limited by these terms. Unless the context indicates otherwise, these terms are only used to distinguish one element, component, or circuit from another element, component, or circuit, for example as a naming convention. Thus, a first element, component, or circuit discussed below in one section of the specification could be termed a second element, component, or circuit in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a component is referred to as being "connected" or "coupled" to or "on" another component, it can be directly connected or coupled to or on the other component or intervening components may be present. In contrast, when a component is referred to as being "directly connected" or "directly coupled" to another component, there are no intervening components present. Terms "electrically connected" or "electrically coupled" and other words used to describe the relationship between elements should be interpreted in a like fashion (e.g., "between" versus "directly between," "adjacent" versus "directly adjacent," etc.).

As used herein, items described as being "electrically connected" are configured such that an electrical signal can be passed from one item to the other at least at some circumstances. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component.

As used herein, the terms "network" and "circuit" are interchangeable in the present disclosure, where the term "circuit" is more likely referred to describe from the perspective of physical and electrical connection and arrangement among the components, and the term "network" is more likely referred to describe equivalent topologies between an input port and an output port.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, analog circuits, hard-wired circuits, memory elements, wiring connections, and the like, which may be formed using semiconductor-based fabrication techniques or other manufacturing technologies. Each block, unit and/or module of the embodiments may be physically separated into two or more interacting and discrete blocks, units and/or modules. Further, the blocks, units and/or modules of the various embodiments may be physically combined into more complex blocks, units and/or modules.

FIG. 1A is a block diagram of a RF power amplifier according to some exemplary embodiments of the present disclosure. Refer to FIG. 1A, the RF power amplifier 100 could be a switch mode RF power amplifier designed for operating at a fundamental frequency, ranging from 0.3 GHz to 3000 GHz, and configured to electrically connect a load $Z_{LOAD}$ for providing amplified RF signal to drive the load $Z_{LOAD}$. In some embodiments, the fundamental frequency could be the frequency using in 4G or 5G MIMO application, or any other frequency used in other applications (X band, Ka band, Ku Band, etc).

The RF power amplifier 100 includes a transistor-based amplifier 110 and a hybrid integrated matching circuit 120, in which the amplifier 110 includes a transistor TR1. The transistor TR1 is biased to amplify an input RF signal RFin received from the gate electrode and to output an amplified signal through the drain electrode. In the present embodiment, FIG. 1A depicts the amplifier 110 is a single stage amplifier as an example, and therefore the gate electrode of the transistor TR1 can be referred to the input terminal of the amplifier 110 and the drain electrode of the transistor TR1 can be referred to the output terminal of the amplifier 110, but the invention is not limited thereto. In some embodiments, the amplifier 110 can be a multi-stage amplifier including two or more transistors, which will be further explained in other embodiments of the present disclosure.

The hybrid integrated matching circuit 120 is electrically connected between the drain electrode of the transistor TR1 and the load $Z_{LOAD}$ and configured to transform the output impedance of the transistor TR1 to match with the impedance of the load $Z_{LOAD}$ at the fundamental frequency and also at the harmonic frequencies, such as the second harmonic frequency (hereinafter "$2^{nd}$ harmonic") and/or third harmonic frequencies (hereinafter "$3^{rd}$ harmonic").

Figure 1B:
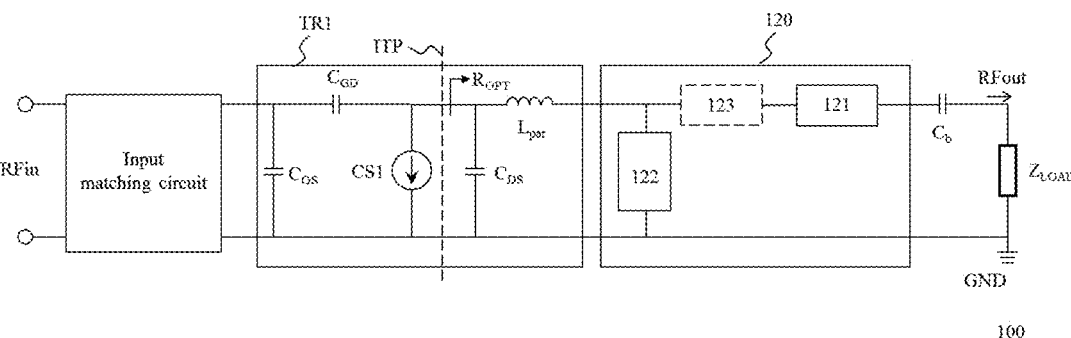
FIG. 1B is an equivalent circuit diagram of a RF power amplifier according to some exemplary embodiments of FIG. 1A.

Further refer to FIG. 1A and FIG. 1B, in which FIG. 1B is an equivalent circuit diagram of a RF power amplifier according to some exemplary embodiments of FIG. 1A. In the present embodiment, the transistor TR1 is illustrated as an equivalent model including a current source CS1 and parasitic components between electrodes, for example, parasitic capacitances $C_{GD}$, $C_{GS}$, and $C_{DS}$ and a parasitic inductance $L_{par}$.

The hybrid integrated matching circuit 120 includes a first circuit 121 and a second circuit 122. The first circuit 121 has a first terminal electrically connected to the drain electrode of the transistor TR1 and a second terminal electrically connected to the load $Z_{LOAD}$. The second circuit 122 is electrically connected between the drain electrode of the transistor TR1 and the RF ground GND.

The first circuit 121 and the output parasitic components $C_{DS}$ and $L_{par}$ operate as an impedance inverter of the RF power amplifier 100, which provides impedance inverting network at the fundamental frequency, while the second circuit 122 presents a high impedance path relative to the RF ground GND at the fundamental frequency.

The second circuit 122 is configured to present an impedance relative to the RF ground GND such that the output impedance $R_O$, which is observed from the intrinsic plane ITP of the transistor TR1, is a high impedance or a low impedance at a first target harmonic of the fundamental frequency to terminate the first target harmonic. In the present embodiment, the first target harmonic can be the $2^{nd}$ harmonic, the $3^{rd}$ harmonic, or any other harmonic frequencies, the present invention is not limited thereto.

To be specific, the hybrid integrated matching circuit 120 forms the impedance inverting network at the fundamental frequency by using the first circuit 121 along with the parasitic components $C_{DS}$ and $L_{par}$ of the transistor TR1, while the second circuit 122 acts as an open circuit or can be regarded as electrically disconnected to the RF power amplifier 100 since the second circuit 122 presents a high impedance relative to the RF ground GND. The hybrid integrated matching circuit 120 further forms the harmonic matching network at the target harmonic by using the parasitic components $C_{DS}$ and $L_{par}$ of the transistor TR1, the first circuit 121, and the second circuit 122.

In other words, the first circuit 121 and the parasitic components $C_{DS}$ and $L_{par}$ of the transistor TR1 components contribute as a part of both the impedance inverting network and the harmonic matching network. The second circuit 122 is mainly used as a harmonic terminating circuit to contribute as a part of the harmonic matching network at the target harmonic. That is to say, the impedance inverting network and the harmonic matching network share the parasitic components $C_{DS}$ and $L_{par}$ and the first circuit 121 and there is no single circuit in the hybrid integrated matching circuit 120 that can provide the impedance inverting network or the harmonic matching network on its own, neither the first circuit 121 nor the second circuit 122. Since the output parasitic capacitance $C_{DS}$, the output parasitic inductance $L_{par}$, the first circuit 121, and the second circuit 122 are all merged together to become a part of the impedance inverting network and the harmonic matching network at different frequencies, the impedance inverting network and the harmonic matching network can be regarded as being "hybrid integrated".

From another perspective of view, the hybrid integrated matching circuit can be referred to any output matching network which uses the transistor output parasitic capacitance and inductance for accomplishing both impedance inversion and also providing one or two harmonic load terminations (e.g., $2^{nd}$ harmonic and $3^{rd}$ harmonic loads). This creates a hybrid structure where all the transistor parasitic, the impedance inverting network and the harmonic matching network can be merged together into one unit giving a miniaturization design for the RF power amplifier 100.

In addition, the second circuit 122 is equivalent to an open circuit which does not affect the impedance inverting network at the fundamental frequency. In other words, at the fundamental frequency, the output impedance $R_O$ is substantially irrelevant to the impedance presented by the second circuit relative to the RF ground.

In some embodiments, the second circuit 122 is further configured to present an impedance relative to the RF ground GND such that the output impedance $R_O$ is a high impedance or a low impedance at a second target harmonic so as to terminate the second target harmonic. Similarly, the second target harmonic can be the $2^{nd}$ harmonic, the $3^{rd}$ harmonic, or any other harmonic frequencies, which is different from the first target harmonic, the present invention is not limited thereto.

More specifically, the second circuit 122 can be designed for modulating the harmonic impedance (or terminating the harmonic effect) at multiple harmonic frequencies, so that the high efficiency switch mode power amplifier topology, such as class F, class $F^{-1}$, class J, class S, etc., can be achieved. For example, the second circuit 122 can be designed for causing the output impedance $R_O$ is a high impedance at the $2^{nd}$ harmonic and a low impedance at the $3^{rd}$ harmonic, so that the transistor TR1 can operate in class $F^{-1}$ mode. For another example, the second circuit 122 can be designed for causing the output impedance $R_O$ is a low impedance at the $2^{nd}$ harmonic and a high impedance at the $3^{rd}$ harmonic, so that the transistor TR1 can operate in class F mode. For yet another example, the second circuit 122 can be designed for causing the output impedance $R_O$ is a high impedance at the $2^{nd}$ harmonic while the $3^{rd}$ harmonic impedance is not terminated, so that the transistor TR1 can operate in partial inverse class F mode.

In some embodiments, the impedance inverting network provided by the hybrid Integrated matching circuit 120 can be any low pass impedance inverting transformer using at least one shunt type reactance. For example, by selecting the proper topology of the first circuit 121, the impedance inverting network can be a low pass $n^{th}$ stage lumped quarter wave transformer, a low pass $n^{th}$ stage reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer, or a quasi-lumped low pass quarter wave stepped impedance quarter wave transformer.

It should be noted that, the impedance inverting network is not necessary to present on the circuit board physically and entirely since the parasitic capacitance $C_{DS}$/parasitic inductance $L_{par}$ is used as a part of the impedance inverting network. In other words, a RF power amplifier without a fully visible impedance inverting network does not necessary mean that the RF power amplifier falls out of the claim scope. As long as the claimed elements can read on the equivalent circuit of the RF power amplifier, the power amplifier still falls into the scope intended to cover by the present invention.

In some embodiments, the second circuit 122 can be disposed adjacent and directly connected to the drain electrode of the transistor TR1, which means there is a component in the second circuit 122 is physically disposed closest and directly connected to the drain electrode of the transistor TR1 compared to other components in the hybrid integrated matching circuit 120.

In some embodiments, the RF power amplifier 100 further includes an input matching circuit 130 electrically connected to the input terminal of the amplifier 110 and configured to transmit the input RF signal RFin, received from a power source, to the input terminal of the amplifier 110. From another perspective of view, the input matching circuit 130 is electrically connected to the gate electrode of the transistor TR1 and transmits the input RF signal RFin to the gate electrode of the transistor TR1.

In some embodiments, the RF power amplifier 100 further includes a DC block capacitor Cb electrically connected between the hybrid integrated matching circuit 120 and the load $Z_{LOAD}$ and configured to prevent the DC signal from entering the load $Z_{LOAD}$.

In some embodiments, the hybrid integrated matching circuit 120 further includes a compensation circuit 123. The compensation circuit 123 is electrically connected between the first circuit 121 and the second circuit 122 and configured to compensate the harmonic matching network.

In some embodiments, the compensation circuit 123 can be implemented by a LC resonator configured to resonate at the fundamental frequency and to correct improper harmonic load terminations. The compensation circuit 123 can be used for any RF power amplifier employing one or two harmonic load terminations.

In some embodiments, the hybrid Integrated matching circuit 120 can be used on III-V (GaAs or InP or GaN), Si, Sol, CMOS, SiGe and various other semiconductor technology platform for RFIC, RF HYBRID IC or RF discrete applications.

In some embodiments, the transistor TR1 can be made of a semiconductor material having relatively large fundamental impedance at intrinsic plane. For example, GaN.

In some embodiments, part of the passive components included in the hybrid integrated matching circuit 120 can be done on MMIC and another part of the passive components can be done in the discrete substrate such as PCB, laminate, etc board.

In some embodiments, the hybrid Integrated matching circuit 120 can also be used for pure discrete RF switch mode power amplifier and Doherty power amplifiers.

Figures 2A, 2B:
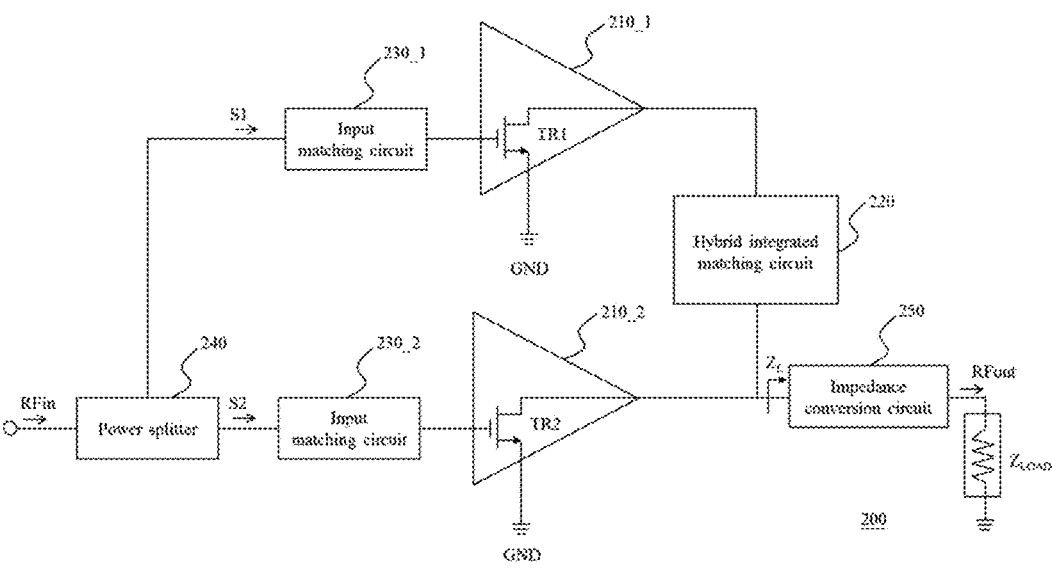
FIG. 2A is a block diagram of a RF power amplifier having multiple transistors according to some exemplary embodiments of the present disclosure.
FIG. 2B is an equivalent circuit diagram of a RF power amplifier according to some exemplary embodiments of FIG. 2A.

The exemplary embodiments of the RF power amplifier having multiple transistors are illustrated as shown in FIGS. 2A and 2B, in which FIG. 2A is a block diagram of a RF power amplifier having multiple transistors according to some exemplary embodiments of the present disclosure, and FIG. 2B is an equivalent circuit diagram of a RF power amplifier according to some exemplary embodiments of FIG. 2A.

Refer to FIG. 2A, the RF power amplifier 200 includes two stage transistor-based amplifiers 210_1 and 210_2 and a hybrid integrated matching circuit 220. The amplifiers 210_1 and 210_2 are similar to the amplifier 110 described in FIGS. 1A and 1B and respectively include a first transistor TR1 and a second transistor TR2. The second transistor TR2 is electrically connected to the first transistor TR1 in parallel through the hybrid integrated matching circuit 220, in which the first transistor TR1 and the second transistor TR2 are configured to share the load $Z_{LOAD}$. From the perspective of the hybrid integrated matching circuit 220, the hybrid integrated matching circuit 220 has a terminal electrically connected to the first transistor TR1 and the other terminal electrically connected to the second transistor TR2 and also to the load $Z_{LOAD}$. From the perspective of the equivalent circuit, the first transistor TR1 and the second transistor T2 can also refer to share the common load $Z_L$, which could be different from the impedance of the load $Z_{LOAD}$ (normally a static load with 50 ohm). Both the load $Z_{LOAD}$ and the common load $Z_L$ are referred to "load" in the following description.

In some embodiments, the RF power amplifier 200 can be referred to a Doherty power amplifier (hereinafter "Doherty power amplifier 200"), in which the amplifier 210_1 can be referred to the main amplifier (hereinafter "main amplifier 210_1") for the Doherty power amplifier and the amplifier 210_2 can be referred to the peaking amplifier (hereinafter "peaking amplifier 210_2") for the Doherty power amplifier. From the perspective of the transistor level, the first transistor TR1 can be referred to the main transistor (hereinafter "main transistor TR1") and the second transistor TR2 can be referred to the peaking transistor (hereinafter "peaking transistor TR2"). In order to clearly explain the connection relationship between the components, the following are described in terms of transistors. People having ordinary skill in the art may understand the correspondence between the amplifier and the transistor thereof by referring the disclosed embodiments.

The hybrid integrated matching circuit 220 is configured to transform the output impedance $R_{Om}$ of the main transistor TR1 and the output impedance $R_{Op}$ of the peaking transistor TR2 to match with the impedance of the modulated load $Z_{Lm}$ and $Z_{Lp}$ for the main and peaking amplifier 210_1 and 210_2 respectively, at the fundamental frequency and also at the harmonic frequencies. Herein, the output impedance $R_{Om}$ of the main transistor TR1 is the impedance observed from the intrinsic plane ITPm of the main transistor TR1, and the output impedance $R_{Op}$ of the peaking transistor TR2 is the impedance observed from the intrinsic plane ITPp of the peaking transistor TR2. In addition, hybrid integrated matching circuit 220 further provides the phase shift, for example around 90 degrees, to the output signal of the main transistor TR1. It should be noted that, people having ordinary skill in the art may understand the phase shift does not need to be exactly and always 90 degrees and can differ as well.

The Doherty power amplifier 200 can further include input matching circuits 230_1 and 230_2, a power splitter 240, and an impedance conversion circuit 250. The input matching circuits 230_1 and 230_2 are respectively connected to the gate electrodes of the main transistor TR1 and the peaking transistor TR2. The function and operation of the input matching circuits 230_1 and 230_2 are similar to that of in FIG. 1A, and thus not repeated herein.

However, note that the input matching circuits 230_1 and 230_2 can also be used for providing phase shift of around 90 degrees between the input signals S1 and S2 to compensate the phase shift provided by the hybrid Integrated Matching circuit 220 between the output signals from transistor TR1 and TR2 and the present invention is not limited thereto.

The power splitter 240 is electrically connected to the input terminals of the input matching circuits 230_1 and 230_2 and configured to convert the input RF signal RFin into two signals S1 and S2 having phase difference to compensate the phase shift provided by the hybrid integrated matching circuit 220. For example, the signal S2 may have around 90 degrees phase delay compared to signal S1, and signal S1 may have the same phase with the input RF signal RFin. In some embodiments, the power splitter 240 can be a 90-degree Hybrid splitter, a Wilkinson power splitter, or a simple direct input power splitter, etc., but the present invention is not limited thereto.

In some embodiments, the power splitter 240 can use even or uneven input power splitting. The uneven input power splitting is done so that more power is given to the peaking transistor TR2 during load modulation and less power is given to the peaking transistor TR2 when the peaking transistor TR2 is open and no-load modulation takes place. The uneven input power splitting is used when the main transistor TR1 and the peaking transistor TR2 are sized as a symmetrical Doherty power amplifier. Even input power splitting on the other hand can be used when the sizes of the main transistor TR1 and the peaking transistor TR2 are quite different, for asymmetrical Doherty power amplifier (typically size of the peaking transistor TR2 is twice the size of the main transistor TR1), but the present invention is not limited thereto.

The impedance conversion circuit 250 has one end electrically connected to the peaking transistor TR2 and the hybrid integrated matching circuit 220 and the other end electrically connected to the load $Z_{LOAD}$. The impedance conversion circuit 250 is configured to transform the load $Z_{LOAD}$, which is typically 50 ohms, to the load $Z_L$ having the impedance of half of the fundamental impedance of the main transistor TR1. In some embodiments, the impedance conversion circuit 250 can be, for example, a simple LC network or distributed quarter wave transmission line, or lumped or reduced length quarter wave transmission line with characteristic impedance equals to $$\sqrt{\frac{Z_{LOAD} * R_{OPT}}{2}}.$$

Further refer to FIG. 2A and FIG. 2B, the main transistor TR1 and the peaking transistor TR2 have the equivalent model similar to the transistor TR1 shown in FIG. 1B. The main transistor TR1 includes a current source CS1, parasitic capacitances $C_{GD1}$, $C_{GS1}$, and $C_{DS1}$, and a parasitic inductance $L_{par1}$. The peaking transistor TR2 includes a current source CS2, parasitic capacitances $C_{GD2}$, $C_{GS2}$, and $C_{DS2}$, and a parasitic inductance $L_{par2}$. In addition, the load $Z_L$ can be referred to the common load shared by the main transistor TR1 and the peaking transistor TR2.

In the present embodiment, the hybrid integrated matching circuit 220 includes a first circuit 221 and at least one of a second circuit 222 and a third circuit 223, depending on the topology of the hybrid integrated matching circuit 220 is applied. To be specific, the hybrid integrated matching circuit 220 can be further divided into the fully hybrid topology and one-side hybrid topology. The fully hybrid integrated matching circuit 220 refers to the parasitic components from both the main transistor TR1 and the peaking transistor TR2 are used as a part of the impedance inverting network, the relevant embodiments will be further described in detail in FIGS. 4A and 4B. The one-side hybrid integrated matching circuit 220 refers to the parasitic component from only one of the main transistor TR1 and the peaking transistor TR2 is used as a part of the impedance inverting network, while the parasitic component from the other one of the main transistor TR1 and the peaking transistor TR2 will be cancelled or omitted, the relevant embodiments will be further described in detail.

If the fully hybrid topology is used, the fully hybrid integrated matching circuit 220 includes the first circuit 221 and both the second circuit 222 and the third circuit 223. The first circuit 221 has a first terminal electrically connected to the drain electrode of the main transistor TR1 and a second terminal electrically connected to the drain electrode of the peaking transistor TR2 and also to the load $Z_L$. The first terminal and the second terminal of the first circuit 221 are further connected to the second circuit 222 and the third circuit 223, respectively. The second circuit 222 is electrically connected between the drain electrode of the main transistor TR1 and the RF ground GND. The third circuit 223 is electrically connected between the drain electrode of the peaking transistor TR2 and the RF ground GND.

The first circuit 221, the output parasitic components $C_{DS1}$ and $L_{par1}$ of the main transistor TR1, and the output parasitic components $C_{DS2}$ and $L_{par2}$ of the peaking transistor TR2 operate as an impedance inverter of the Doherty power amplifier 200, which provides impedance inverting network at the fundamental frequency, while the second circuit 222 and the third circuit 223 respectively present a high impedance path relative to the RF ground GND at the fundamental frequency.

The second circuit 222 presents an impedance relative to the RF ground GND such that the output impedance $R_{Om}$ of the main transistor TR1 is a high impedance or a low impedance at the first target harmonic of the fundamental frequency to terminate the first target harmonic.

The third circuit 223, similar to the second circuit 222, presents an impedance relative to the RF ground GND such that the output impedance $R_{Op}$ of the peaking transistor TR2 is a high impedance or a low impedance at the first target harmonic of the fundamental frequency to terminate the first target harmonic.

In addition, in some embodiments, the second circuit 222 and the third circuit 223 can further present an impedance relative to the RF ground GND, respectively, such that the output impedances $R_{Om}$ and $R_{Op}$ are a high impedance or a low impedance at the second target harmonic of the fundamental frequency to terminate the second target harmonic.

To be specific, the fully hybrid integrated matching circuit 220 forms the impedance inverting network at the fundamental frequency by using the first circuit 121 along with the parasitic components $C_{DS1}$ and $L_{par1}$ of the main transistor TR1 and the parasitic components $C_{DS2}$ and $L_{par2}$ of the peaking transistor TR2, while the second circuit 222 and the third circuit 223 act as an open circuit or can be regarded as electrically disconnected to the RF power amplifier 200 since the second circuit 222 and the third circuit 223 present a high impedance relative to the RF ground GND, respectively.

The hybrid integrated matching circuit 220 further forms the harmonic matching network at the target harmonic by using the parasitic components $C_{DS1}$ and $L_{par1}$ of the main transistor TR1, the parasitic components $C_{DS2}$ and $L_{par2}$, the first circuit One, the second circuit 222, and the third circuit 223. In other words, the harmonic matching network for the main transistor TR1 can be formed by at least the parasitic component $C_{DS1}/L_{par1}$ of the main transistor TR1, the first circuit 221, and one of the second circuit 222 and the third circuit 223, and the harmonic matching network for the peaking transistor TR2 can be formed by at least the parasitic component $C_{DS2}/L_{par2}$ of the peaking transistor TR2, the first circuit 221, and one of the second circuit and the third circuit.

Compared to the hybrid integrated matching circuit 120 used in the RF power amplifier 100 shown in FIGS. 1A and 1B, the fully hybrid integrated matching circuit 220 further uses the parasitic components from the additional transistor (i.e., peaking transistor TR2) as a part of the impedance inverting network at the fundamental frequency and the harmonic matching network at one or more harmonic frequencies.

In some embodiments, the second circuit 222 and the third circuit 223 include the same circuit topology.

If the one-side hybrid topology is used, the one-side hybrid integrated matching circuit 220 includes the first circuit 221, the second circuit 222, the third circuit 223, and only one of the parasitic cancellation circuit 226/227. The similar part of the one-side hybrid integrated matching circuit 220 can refer to the embodiments of the fully hybrid integrated matching circuit 220 described above, which will be not further repeated herein.

In the embodiment of using the one-side hybrid topology, the second circuit 222 is electrically connected between the drain electrode of one of the main transistor TR1 and the peaking transistor TR2 and the RF ground GND. The third circuit 223 is electrically connected between the drain electrode of the other one of the main transistor TR1 and the peaking transistor TR2. The parasitic cancellation circuit 226/227 is electrically connected to the drain electrode of the main transistor TR1 or the peaking transistor TR2.

For example, if the parasitic component of the main transistor TR1 is used to form the impedance inverting network, the parasitic cancellation circuit 227 is applied and electrically connected between the drain electrode of the peaking transistor TR2 and the RF ground GND. Therefore, the first circuit 221 can be selected and sized to form the impedance inverting network along with the parasitic capacitance $C_{DS1}$ and the parasitic inductance $L_{par1}$ of the main transistor TR1. The parasitic capacitance $C_{DS2}$ and the parasitic inductance $L_{par1}$ can be omitted from the impedance inverting network since the parasitic components are effectively cancelled out by the parasitic cancellation circuit 227. In this example, the impedance inverting network can be regarded as equal to that of illustrated in FIGS. 1A and 1B.

For another example, if the parasitic component of the peaking transistor TR2 is used to form the impedance inverting network, the parasitic cancellation circuit 226 is applied and electrically connected between the drain electrode of the main transistor TR1 and the RF ground GND. Therefore, the first circuit 221 can be selected and sized to form the impedance inverting network along with the parasitic capacitance $C_{DS2}$ and the parasitic inductance $L_{par2}$ of the peaking transistor TR2. The parasitic capacitance $C_{DS1}$ and the parasitic inductance $L_{par1}$ can be omitted from the impedance inverting network since the parasitic components are effectively cancelled out by the parasitic cancellation circuit 226.

For the embodiments of the one-side hybrid integrated matching circuit 220, in addition to the parasitic component of the main transistor TR1/the peaking transistor TR2, the first circuit 221, and the second circuit 222, the parasitic cancellation circuit 226/227 also contributes as a part of the harmonic matching network.

It should be noted that, FIG. 2B shows the second circuit 222 and the third circuit 223 are electrically connected to the main transistor TR1 and the peaking transistor TR2, respectively, but the present invention is not limited thereto. In another embodiment, the second circuit 222 can be electrically connected to the drain electrode of the peaking transistor TR2 and the third circuit 223 can be electrically connected to the drain electrode of the main transistor TR1. In still another embodiment, one of the second circuit 222 and the third circuit 223 can be omitted, so that harmonic matching network for only one of the main transistor TR1 and the peaking transistor TR2 is applied.

In some embodiments, the hybrid integrated matching circuit 220 further includes the compensation circuit 224/225. As shown in FIG. 2B, the compensation circuit 224 is electrically connected between the first terminal of the first circuit 221 and the second circuit 222, and the compensation circuit 225 is electrically connected between the second terminal of the first circuit 221 and the third circuit 223. The operation and the function of the compensation circuit 224/225 can refer to those of in FIG. 1B, which will not be repeated herein.

As stated above, the hybrid Integrated matching circuit 120/220 provides load modulation over a wide bandwidth using transistor parasitic for designing the impedance inverting network and also provides multiple harmonic load terminations (e.g., $2^{nd}$ harmonic and $3^{rd}$ harmonic). The high efficiency switch mode topologies like class F, $F^{-1}$, J, etc and also continuous modes class F, $F^{-1}$, J, etc., can be applied to individual main and or peaking amplifiers. In addition, the load $Z_L$ is set to equal to half of the fundamental impedance of the transistor TR1. This further helps the fully hybrid Integrated matching circuit to have no fundamental matching network, which if used, usually cause bandwidth limitations and it also helps to miniaturize the overall design of the output matching side of the invented Doherty power amplifier.

Accordingly, the RF power amplifier 100/200 of the present disclosure has the advantage of providing both high bandwidth and high efficiency thus solving bandwidth limitation problem for the conventional Doherty power amplifier which comes from the device output parasitic capacitance and inductance and also providing very high efficiency using miniaturized harmonic matching network instead of complex bulky harmonic matching network. In addition, by using transistor output parasitic capacitance and inductance for designing impedance inverting network, the fundamental matching network or offset lines can be omitted, thus solving the bandwidth limitation.

Further, by disposing the second circuit/third circuit which operates as the harmonic termination circuit extremely close and directly connect to the drain electrode of the main transistor/peaking transistor, the output characteristic can be further improved.

Also, the architecture can be significantly reduced using the embodiments of the present disclosure. The present invention is not limited to one main transistor TR1 and one peaking amplifier TR2 but can also incorporates cascade stage of main and peaking amplifiers for high gain applications, which will be further explained later. Also, the hybrid Integrated matching circuit is not limited to the design shown in the embodiments and can be of any type as long as they satisfy the main idea of this invention which is using the transistor parasitic for providing load modulation and at least one harmonic termination at the same time.

It should be noted that, the harmonic matching network provided by the hybrid integrated matching circuit 120/220 is not limited to include only the above mentioned components. The actual harmonic matching network can include other components not mentioned. For example, the load $Z_{Lm}$ and $Z_{Lp}$ can also be regarded as a part of the harmonic matching network for main amplifier and peaking amplifier, although the load $Z_{Lm}$ and $Z_{Lp}$ have less significance to the harmonic matching network due to weakly coupling.

The compact and miniaturized design for Hybrid Integrated Matching circuit can be integrated easily for RF Multi-Input and Multi-Output (MIMO) applications and others. In some embodiments of the present disclosure, the passive components of the harmonic matching network can be internally matched within the device and become open circuit at fundamental making the overall circuit design compact and integrated.

In accordance with another aspect of the present invention for Doherty power amplifier connecting network design, the Fully hybrid Integrated matching circuit composed of three different types while the One-Sided hybrid Integrated Matching circuit is composed of four different types, depending on the conditions whether the parasitic output capacitance of the device $C_{DS}$ is higher or lower than the equivalent shunt capacitance $C_O$ or $C_{OT}$ of the low pass π-type lumped or reduced-length quarter wave transmission line acting as impedance inverting network.

In order to make the main function of the circuit can be easily identified, the first circuit 121/221 is referred to an impedance inverter 121/221 hereinafter since the first circuit 121/221 dominates the impedance inverting network at the fundamental frequency, and the second circuit 122/222 and the third circuit 223 are referred to the harmonic termination circuit hereinafter since it provides the harmonic termination network for the target harmonic. It should be noted that, the terms "first circuit" and "impedance inverter" are interchangeable and the terms "second circuit/third circuit" and "harmonic termination circuit" are interchangeable in the present disclosure, however, it not necessarily means the first circuit/impedance inverter is solely for providing the impedance inverting network. As discussed above, the first circuit contributes as a part of both the impedance inverting network and the harmonic matching network.

Figure 3A:
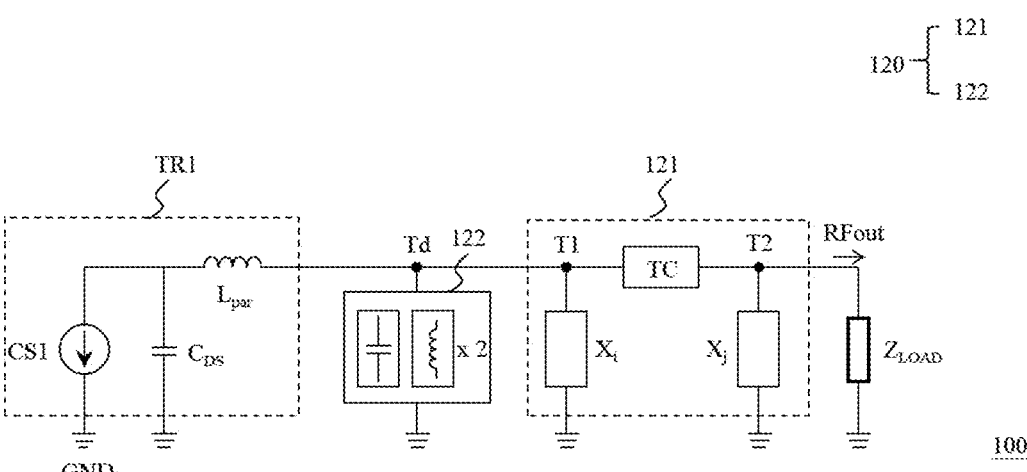
Figure 3B:
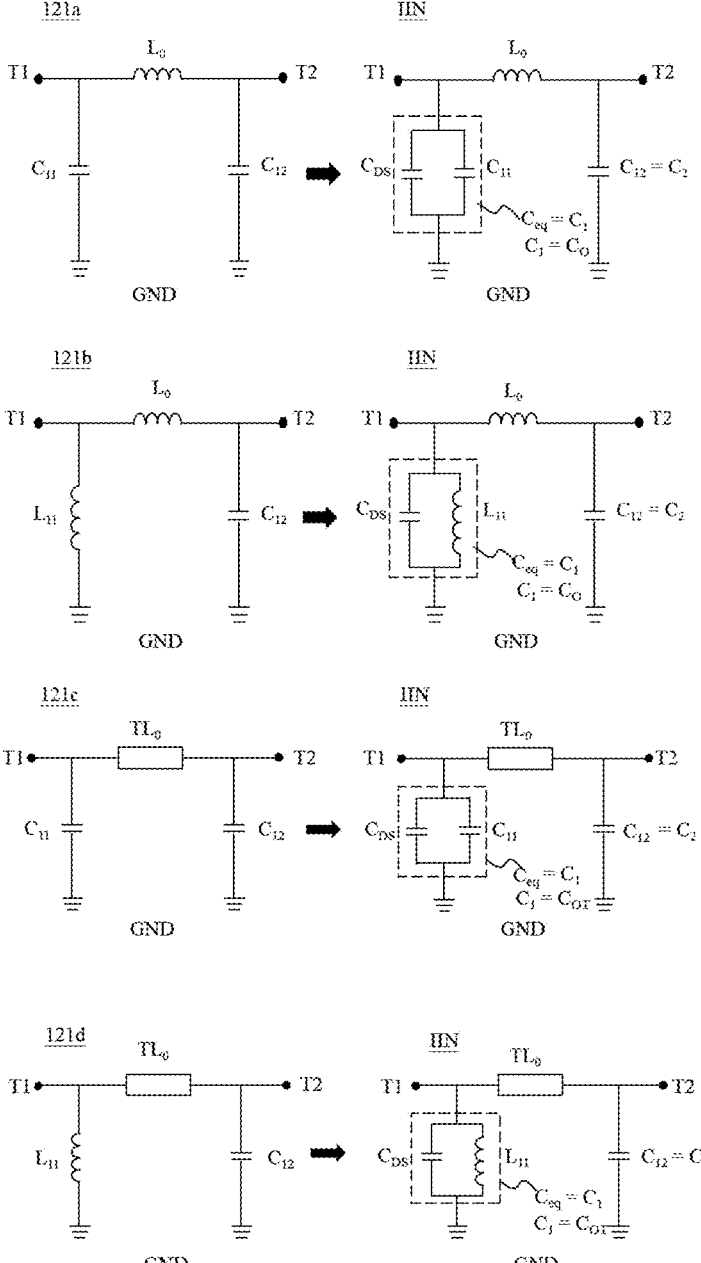

FIGS. 3A-3C are schematic circuit diagrams of a RF power amplifier having a hybrid integrated matching circuit according to some exemplary embodiments of FIG. 1B.

Refer to FIG. 3A, which illustrates schematic structure of the impedance inverter 121 and the harmonic termination circuit 122. The impedance inverter 121 includes a transmission circuit TC and two reactance components $X_i$ and $X_j$. The transmission circuit TC is electrically connected between the first terminal T1 and the second terminal T2. The reactance component $X_i$ is electrically connected between the first terminal T1 and the RF ground GND. The reactance component $X_j$ is electrically connected between the second terminal T2 and the RF ground GND. The reactance components $X_i$ and $X_j$ can be capacitive or inductive, based on the relationship of the device parasitic capacitance $C_{DS}$ and shunt capacitance value of the impedance inverting network used.

The harmonic termination circuit 122 includes a capacitive component and two inductive components, in which the capacitive component is electrically connected to one of the inductive components in parallel and to the other one of the inductive components in series.

In some embodiments, the transmission circuit TC includes at least one of an inductor and a transmission line, depending on the design choice of the type of impedance inverting network used.

In some embodiments, at least one of the capacitive component and the two inductive components could be configured to directly connect to the drain electrode of the transistor TR1.

In some embodiments, one of the capacitive component and the two inductive components is disposed closest to the drain electrode of the transistor TR1 in the circuit layout.

Further refer to FIG. 3B, which shows the various exemplary embodiments of the impedance inverter 121 shown in FIG. 3A.

According to the process, material, and size of the transistor TR1, which may affect the output parasitic capacitance presented by the transistor TR1, the impedance inverter 121 can be selectively implemented by the impedance inverter 121a-121d, in which each implementation constitutes, along with the output parasitic capacitance $C_{DS}$ of the transistor TR1, a corresponding impedance inverting network IIN.

In the present embodiment, the impedance inverters $121a$-$121d$ are taking one stage low pass $\pi$-type quarter wave transformer/filter as an example, in which the transmission circuit TC is implemented by the inductor $L_0$ or the transmission line $TL_0$, and the reactance component $X_j$ electrically connected to the second terminal T2 is implemented by the capacitor $C_{12}$. The reactance component $X_i$ electrically connected to the first terminal T1 can be implemented by the capacitor $C_{11}$ (see the impedance inverter $121a$, $121c$) or the inductor $L_{11}$ (see the impedance invert $121b$, $121d$), depending on whether the output parasitic capacitance $C_{DS}$ is greater than the capacitance of the capacitor $C_{12}$ of the one stage low pass $\pi$-type quarter wave transformer/filter. To be specific, the one stage low pass $\pi$-type lumped quarter wave transformer/filter consists of two shunt capacitors $C_O$ and one series connected inductor $L_0$ while the one stage low pass $\pi$-type reduced length quarter wave transformer/filter consists of two shunt capacitors $C_{OT}$ and one series connected the transmission line $TL_0$ In order to make the impedance inverting network IIN equal to a one stage low pass $\pi$-type lumped or reduced-length quarter-wavelength transmission line with a 90 degrees phase delay, the inductor $L_0$ or the transmission line $TL_0$ can be sized to meet the below equation:

$$L_O = \frac{R_{OPT}}{\omega_0};$$

$$Z_0 = \frac{R_{OPT}}{\sqrt{1 - (\omega_0 * C_{OT} * R_{OPT})^2}};$$

$$\theta_O = \cos^{-1}(\omega_0 * C_{OT} * R_{OPT});$$

where $R_{OPT}$ is the fundamental impedance, $\omega_o$ is the fundamental frequency, $C_{OT}$ is the shunt capacitance of the one stage low pass $\pi$-type reduced-length quarter-wavelength transmission line, $Z_0$ is the characteristic impedance of the transmission line $TL_0$, and $\theta_0$ is the electrical angle of the transmission line $TL_0$.

The capacitor $C_{12}$ is sized to have the capacitance $C_O$ calculated from the fundamental impedance of the transistor TR1, in which the capacitance $C_O$ follows below the equation of $$C_O = \frac{1}{R_{OPT}\omega_0}.$$

Similarly, the capacitor $C_{12}$ is sized to have the capacitance $C_{OT}$ calculated from the fundamental impedance of the transistor TR1 using equation not shown here. Note that $C_{OT}$ and $C_O$ uses different equations.

When the output parasitic capacitance $C_{DS}$ is less than the capacitance $C_{12}$, the capacitor $C_{11}$ is selected to implement the reactance component $X_i$, so that the equivalent capacitance of the $C_{11}$ and $C_{DS}$ equal to the capacitance $C_{12}$. Therefore, in order to fulfill the above requirement, the capacitor $C_{11}$ can be sized to meet below equation:

$$C_{11} = C_{12} - C_{DS},$$

where $C_{11}$ is the capacitance of the first capacitor.

When the output parasitic capacitance $C_{DS}$ is greater than the capacitance $C_{12}$, the inductor $L_{11}$ is selected to implement the reactance component $X_i$, so that the equivalent capacitance of the $L_{11}$ and $C_{DS}$ equal to the capacitance $C_{12}$.

Therefore, in order to fulfill the above requirement, the inductor $L_{11}$ can be sized to meet below equation:

$$L_{11} = \frac{1}{\omega_0^2(C_{DS} - C_{12})};$$

where $L_{11}$ is the inductance of the first inductor $L_{11}$.

Briefly speaking, a two-port impedance inverting network is used for hybrid integrated matching 220 design. It includes at least one shunt capacitor (e.g., $C_{11}$) or shunt inductor (e.g., $L_{11}$) at the end close to the transistor and series connected to the transmission circuit TC. The shunt capacitor/inductor are configured at the end to absorb the transistor parasitic capacitance and inductance. The four typical generic configurations are shown. In the case $121a$, both the terminals T1 and T2 are connected to shunt capacitors $C_{11}$ and $C_{12}$, respectively. In the case $121b$, only the terminal T2 is connected to shunt capacitor $C_{12}$ and the terminal T1 is connected to the shunt inductance (e.g., $L_{11}$). The case $121c$ is similar to $121a$ and the case $121d$ is similar to $121b$. The difference is that the inductor $L_0$ shown in $121a$/$121b$ is replaced by the transmission line $TL_0$ in $121c$/$121d$ and capacitance $C_0$ shown in $121a$/$121b$ is replaced by the capacitance $C_{OT}$ in $121c$/$121d$.

In some embodiments, the impedance inverting network IIN can be implemented by a quarter wave transmission line, which has the effective circuit structure equal to the one stage low pass $\pi$-type filter as shown in FIG. 3B. The quarter wave transmission line can be sized to meet below equation:

$$Z_T = \sqrt{R_{OPT} * Z_{LOAD}};$$

where $Z_T$ is the characteristics impedance of the quarter wave transmission line and $Z_{LOAD}$ is the impedance of the load.

It should be noted that, although the embodiments shown in FIGS. 3A and 3B depict one stage low pass $\pi$-type quarter wave filter as an example, but the present invention is not limited thereto. For example, the impedance inverting network could be a low pass $n^{th}$ stage lumped quarter wave transformer, a low pass $n^{th}$ stage reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, etc., as long as the impedance inverting network uses a low pass network with shunt capacitance configuration at extreme ends to absorb the device parasitic and the transmission circuit TC in the middle as shown in FIG. 3B.

Further refer to FIG. 3C, which shows the various exemplary embodiments of the harmonic termination circuit 122 shown in FIG. 3A.

The harmonic termination circuit 122 can be selectively implemented by the harmonic termination circuits $122a$-$122j$, in which the harmonic termination circuits $122a$-$122f$ can be used to implement providing a low impedance at $2^{nd}$ harmonic frequency and a high impedance at $3^{rd}$ harmonic frequency, and the harmonic termination circuits $122g$-$122j$ can be used to implement providing a high impedance at $2^{nd}$ harmonic frequency or low impedance at $2^{nd}$ harmonic or low impedance at $3^{rd}$ harmonic frequency.

With respect to the harmonic termination circuit $122a$-$122f$, the harmonic termination circuit includes a first capacitive component (e.g., the capacitor $C_{21}$), a first inductive component (e.g., the inductor $L_{21}$ or the transmission line $TL_{21}$), and a second inductive component (e.g., the inductor $L_{22}$ or the transmission line $TL_{22}$). The first inductive component is electrically connected to the first capacitive component in series and interposed between the drain electrode Td of the transistor TR1 and the RF ground GND. The second inductive component has one end electrically connected to the drain electrode Td of the transistor TR1 and to the first terminal T1 and the other end electrically connected to RF ground GND.

The first capacitive component and the first inductive component are sized to present a low impedance path connecting to the RF ground GND at the first target harmonic of the fundamental frequency. The second inductive component is sized such that the first capacitive component, the first inductive component, and the second inductive component behave as an open circuit relative to the RF ground GND at the fundamental frequency.

To be specific, in the harmonic termination circuit 122a, the capacitive component is implemented by the capacitor $C_{21}$, the first inductive component is implemented by the inductor $L_{21}$, and the second inductive component is implemented by the inductor $L_{22}$. The harmonic terminating network includes a shunt LC network constituted by the inductor $L_{21}$ and capacitor $C_{21}$ connected in series.

The capacitor $C_{21}$ and the inductors $L_{21}$ and $L_{22}$ are sized to meet below equation:

$$L_{21}C_{21} = \frac{1}{(n\omega_0)^2};$$

$$L_{22} = \frac{(1 - \omega_0^2 L_{21}C_{21})}{\omega_0^2 C_{21}};$$

where $C_{21}$ is the capacitance of the capacitor $C_{21}$, $L_{21}$ is the inductance of the inductor $L_{21}$, $L_{22}$ is the inductance of the inductor $L_{22}$, and n is the index for $n^{th}$ harmonic number.

By applying the above setting, the impedance provided to the first terminal T1 by the series circuit of the capacitor $C_{21}$ and the inductor $L_{21}$ will be removed by the inductor $L_{22}$ at the fundamental frequency, so that the harmonic termination circuit 122a behaves as an open circuit relative to the RF ground GND. Thus, the impedance inverting network will be not affected by the harmonic termination circuit 122a at the fundamental frequency.

The series circuit of the capacitor $C_{21}$ and the inductor $L_{21}$ creates a low impedance path at the $2^{nd}$ harmonic frequency, so that the effective circuit observed from the intrinsic plane of the transistor TR1 can be regarded as a short circuit, which means the output impedance $R_O$ of the transistor TR1 is a low impedance. The above equations can be simplified, at the $2^{nd}$ harmonic frequency, as below:

The inductor $L_{21}$ can be calculated using boundary condition equations for class F design, such that the capacitor $C_{21}$ and the inductors $L_{21}$ and $L_{22}$ further present an impedance relative to RF ground to make the effective circuit observed from the intrinsic plane of the transistor TR1 can be regarded as a open circuit at $3^{rd}$ harmonic frequency, which means the output impedance $R_O$ of the transistor TR1 is a high impedance at $3^{rd}$ harmonic frequency. Therefore, the $2^{nd}$ harmonic short and $3^{rd}$ harmonic open operation, which refers to class F operation, can be achieved.

The harmonic termination circuits 122b-122d are similar to the harmonic termination circuit 122a. The difference is that the inductor $L_{21}/L_{22}$ used in the harmonic termination circuit 122a is replaced by the transmission line $TL_{21}/TL_{22}$ which is effectively the same as the inductor $L_{21}/L_{22}$. In other words, the shunt inductor $L_{21}$ can be replaced by the shunt transmission line $TL_{21}$ with characteristics impedance $Z_{21}$ and electrical angle $\theta_{21}$, and the shunt inductor $L_{22}$ can be replaced by the shunt transmission line $TL_{22}$ with characteristics impedance $Z_{22}$ and electrical angle $\theta_{22}$. The similar part can be referred to the embodiment of the harmonic termination circuit 122a described above and will not be further repeated.

$$L_{21}C_{21} = \frac{1}{4\omega_0};$$

$$L_{22} = 3L_{21}.$$

To be specific, in the harmonic termination circuit 122b, the first inductive component is implemented by the transmission line $TL_{21}$, which is sized to meet below equation:

$$Z_{21}\tan(\theta_{21})=\omega_0 L_{21},$$

where $Z_{21}$ is the characteristic impedance of the transmission line $TL_{21}$, and $\theta_{21}$ is the electrical angle of the transmission line $TL_{21}$.

In the harmonic termination circuit 122c, the second inductive component is implemented by the transmission line $TL_{22}$, which is sized to meet below equation:

$$Z_{22}\tan(\theta_{22})=\omega_0 L_{22},$$

where $Z_{22}$ is the characteristic impedance of the transmission line $TL_{22}$, and $\theta_{22}$ is the electrical angle of the transmission line $TL_{22}$.

In the harmonic termination circuit 122d, the first inductive component and the second inductive component are implemented by the transmission lines $TL_{21}$ and $TL_{22}$, respectively. The design criteria for the transmission lines $TL_{21}$ and $TL_{22}$ can refer to the above explanation and will not be further repeated herein.

The harmonic termination circuit 122e is similar to the harmonic termination circuit 122a. The difference is that the first inductive component in the harmonic termination circuit 122e is implemented by the combination of the inductor $L_{21}'$ and the transmission line $TL_{21}'$, in which the effective impedance of the inductor $L_{21}'$ and the transmission line $TL_{21}'$ is equal to that of the inductor $L_{21}$ which is being replaced with. Thus, the inductor $L_{21}'$ and the transmission line $TL_{21}'$ are required to be sized to meet below equation:

$$Z_{21}'\tan(\theta_{21}')+\omega_0 L_{21}'=\omega_0 L_{21};$$

where $Z_{21}'$ is the characteristic impedance of the transmission line $TL_{21}'$, $\theta_{21}'$ is the electrical angle of the transmission line $TL_{21}'$, and $L_{21}'$ is the inductance of the inductor $L_{21}'$.

The harmonic termination circuit 122f is similar to the harmonic termination circuit 122e. The difference is that the second inductive component in the harmonic termination circuit 122f is implemented by the combination of the inductor $L_{22}'$ and the transmission line $TL_{22}'$, in which the effective impedance of the inductor $L_{22}'$ and the transmission line $TL_{22}'$ is equal to that of the inductor $L_{22}$ which is being replaced with. Thus, the inductor $L_{22}'$ and the transmission line $TL_{22}'$ are required to be sized to meet below equation:

$$Z_{22}'\tan(\theta_{22}')+\omega_0 L_{22}'=\omega_0 L_{22};$$

where $Z_{22}'$ is the characteristic impedance of the transmission line $TL_{22}'$, $\theta_{22}'$ is the electrical angle of the transmission line $TL_{22}'$, and $L_{22}'$ is the inductance of the inductor $L_{22}'$.

With respect to the harmonic termination circuits 122g-122j, the harmonic termination circuit includes a first inductive component (e.g., the inductor $L_{21}$ or the transmission line $TL_{21}$) and an LC tank (e.g., the capacitor $C_{CH}$ along with the inductor $L_{CH}$/the transmission line $TL_{CH}$). The LC tank is electrically connected to the first inductive component in series and between the drain electrode Td of the transistor TR1 and the RF ground GND. The LC tank comprises a second inductive component (e.g., the inductor $L_{CH}$/the transmission line $TL_{CH}$) and a first capacitive component (e.g., the capacitor $C_{CH}$) electrically connected in parallel.

The first inductive component and the second inductive component are configured to present the second harmonic high impedance, the second harmonic low impedance, or the third harmonic low impedance at a time, at the intrinsic plane of the transistor TR1.

In other words, the inductance of the first inductive component is configured to present the required second harmonic high impedance termination at the intrinsic plane of that transistor with which the harmonic terminating network is connected.

To be specific, in the harmonic termination circuit 122g, the first inductive component is implemented by the inductor $L_{21}$, the second inductive component is implemented by the inductor $L_{CH}$, and the first capacitive component is implemented by the capacitor $C_{CH}$.

In the present embodiment, the inductor $L_{CH}$ and the capacitor $C_{CH}$ constitute an LC tank and are resonated out at fundamental frequency so that the entire harmonic terminating network present high impedance relative to the RF ground at fundamental frequency and does not affect the impedance inverting network functioning. The inductor $L_{CH}$ and the capacitor $C_{CH}$ are sized to meet the following equation to present a high impedance relative to the RF ground GND at the fundamental frequency:

$$L_{CH}C_{CH} = \frac{1}{(\omega_0)^2};$$

where $L_{CH}$ is the inductance of the inductor $L_{CH}$ and $C_{CH}$ is the capacitance of the capacitor $C_{CH}$.

The harmonic termination circuits 122h-122j are similar to the harmonic termination circuit 122g. The difference is that the inductor $L_{21}/L_{CH}$ used in the harmonic termination circuit 122g is replaced by the transmission line $TL_{21}/TL_{CH}$ which is effectively the same as the inductor $L_{21}/L_{22}$.

In some embodiments, the capacitive component included in the impedance inverter 121 and the harmonic termination circuit 122 can be implemented by a static capacitor or a tunable capacitor, but the present invention is not limited thereto.

Figure 4A:
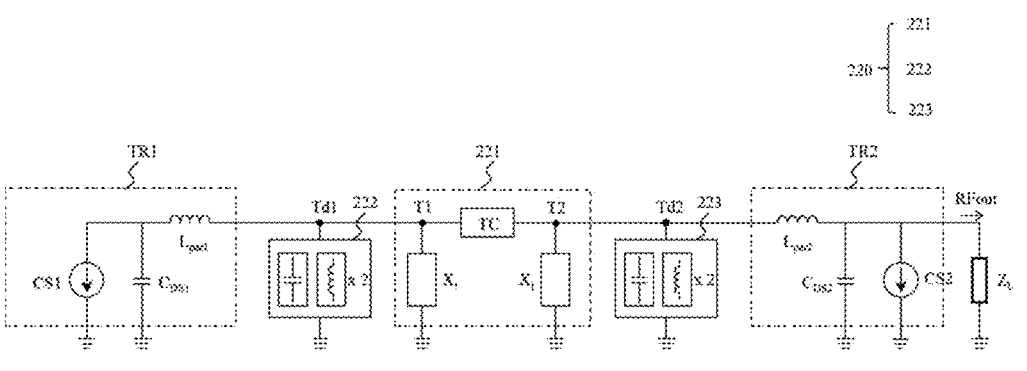
FIGS. 4A and 4B are schematic circuit diagrams of a RF power amplifier having a fully hybrid integrated matching circuit according to some exemplary embodiments of FIG. 2B.
Figure 4C:
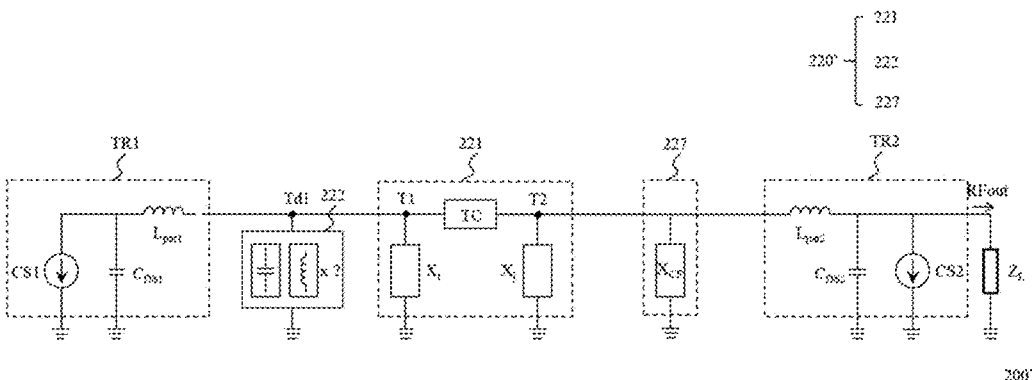
FIGS. 4C and 4D are schematic circuit diagrams of a RF power amplifier having a one-side hybrid integrated matching circuit according to some exemplary embodiments of FIG. 2B.
Figure 4D:
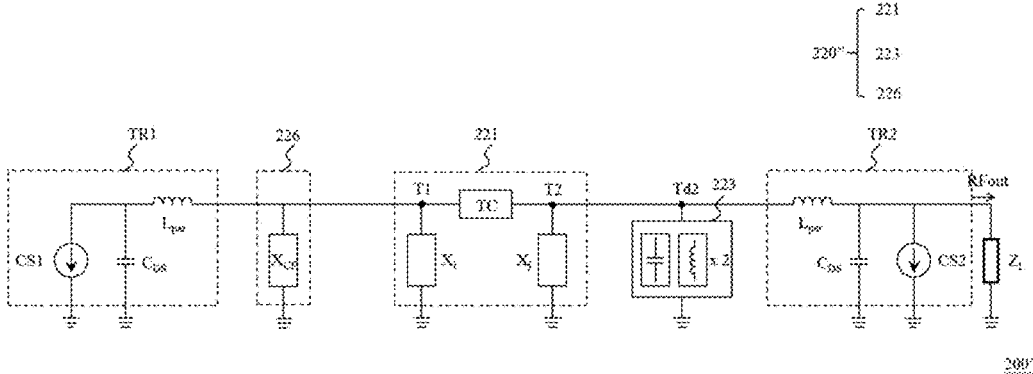
Figure 4B:
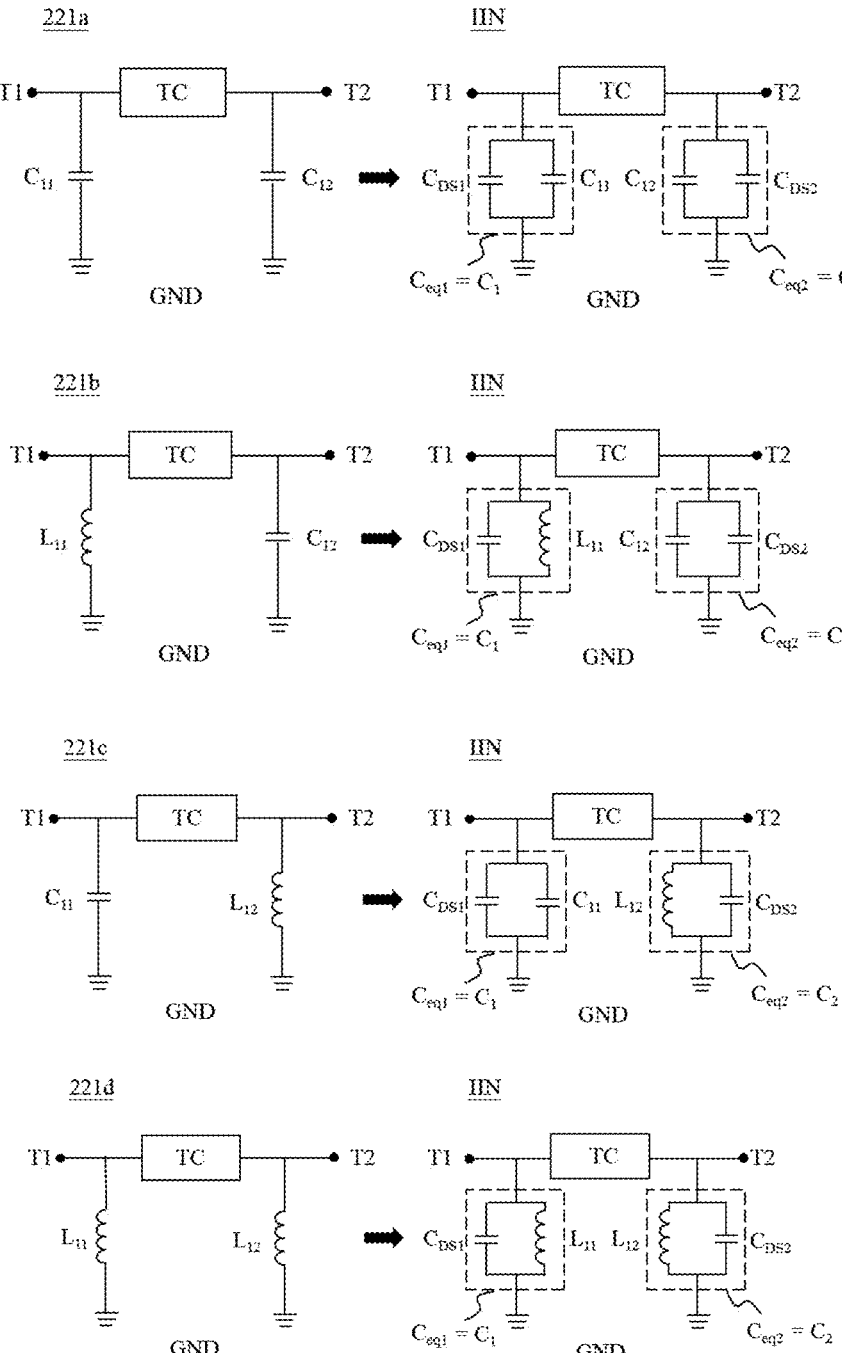

FIGS. 4A and 4B are schematic circuit diagrams of a RF power amplifier having a fully hybrid integrated matching circuit according to some exemplary embodiments of FIG. 2B;

Refer to FIG. 4A, which illustrates schematic structure of the impedance inverter 221 and the harmonic termination circuits 222 and 223 in the fully hybrid integrated matching circuit 220 The impedance inverter 221 includes a transmission circuit TC and two reactance components $X_i$ and $X_j$.

The transmission circuit TC has one end electrically connected to the drain electrode Td1 of the main transistor TR1 through the first terminal T1 and the other end electrically connected to the drain electrode Td2 of the peaking transistor TR2 through the second terminal T2. In other word, the transmission circuit TC is electrically connected between the first terminal T1 and the second terminal T2 and also between the main transistor TR1 and the peaking transistor TR2. The reactance component $X_i$ is electrically connected between the first terminal T1 and the RF ground GND. The reactance component $X_j$ is electrically connected between the second terminal T2 and the RF ground GND.

The harmonic termination circuits 222 and 223 respectively includes a capacitive component and two inductive components, in which the capacitive component is electrically connected to one of the inductive components in parallel and to the other one of the inductive components in series.

In some embodiments, at least one of the capacitive component and the two inductive components in the harmonic termination circuit 222 could be configured to directly connect to the drain electrode of the transistor TR1. Similarly, at least one of the capacitive component and the two inductive components in the harmonic termination circuit 223 could be configured to directly connect to the drain electrode of the transistor TR2.

In some embodiments, one of the capacitive component and the two inductive components in the harmonic termination circuit 222 is disposed closest to the drain electrode Td1 of the transistor TR1 in the circuit layout. Similarly, one of the capacitive component and the two inductive components in the harmonic termination circuit 223 is disposed closest to the drain electrode Td2 of the transistor TR2 in the circuit layout.

Further refer to FIG. 4B, which shows the various exemplary embodiments of the impedance inverter 221 shown in FIG. 4A.

According to the process, material, and size of the transistors TR1 and TR2 which may affect the output parasitic capacitance presented by the transistors TR1 and TR2, the impedance inverter 221 can be selectively implemented by the impedance inverter 221a-221d, in which each implementation constitutes, along with the output parasitic capacitances $C_{DS1}$ and $C_{DS2}$ of the transistors TR1 and TR2, a corresponding impedance inverting network IIN.

In the present embodiment, the impedance inverters 221a-221d are taking generic low pass $n^{th}$ stage quarter wave filter as an example, in which the transmission circuit TC can refer to the those described in the embodiments of FIG. 3B when the impedance inverters 221a-221d is a one stage low pass $\pi$-type quarter wave filter.

The reactance component $X_i$ electrically connected to the first terminal T1 can be implemented by the capacitor $C_{11}$ (see the impedance inverter 221a, 221c) or the inductor $L_{11}$ (see the impedance inverter 221b, 221d), depending on whether the output parasitic capacitance $C_{DS1}$ is greater than the capacitance $C_1$ which could be $C_O$ or $C_{OT}$. Similarly, the reactance component $X_j$ electrically connected to the second terminal T2 can be implemented by the capacitor $C_{12}$ (see the impedance inverter 221b, 221a) or the inductor $L_{12}$ (see the impedance inverter 221d, 221c), depending on whether the output parasitic capacitance $C_{DS2}$ is greater than the capacitance of the capacitor $C_2$ which could be $C_O$ or $C_{OT}$.

The design criteria of the present embodiment is similar to that of the embodiments shown in FIG. 3B. The capacitors $C_{11}$ and $C_{12}$ are sized to meet below equation:

$$C_{11} = C_1 - C_{DS1};$$

$$C_{12} = C_2 - C_{DS2};$$

where the previous definition for each term can also be applied in the present embodiment and $C_1$ can be equal to $C_2$.

In addition, the inductors $L_{11}$ and $L_{12}$ are sized to meet below equation:

$$L_{11} = \frac{1}{\omega_o^2(C_{DS1} - C_1)};$$

$$L_{12} = \frac{1}{\omega_o^2(C_{DS2} - C_2)}.$$

Briefly speaking, the impedance inverter 221 includes at least one shunt capacitor (e.g., $C_{11}/C_{12}$) or shunt inductor (e.g., $L_{11}/L_{12}$) at the end close to the connected transistor TR1/TR2 and series connected to the transmission circuit TC. The shunt capacitor/inductor configuration at the end to absorb the transistor parasitic capacitance and inductance. The four typical generic configurations are shown. In the case 221a, both the terminals T1 and T2 are connected to shunt capacitors $C_{11}$ and $C_{12}$, respectively. In the case 221b, only the terminal T2 is connected to shunt capacitor $C_{12}$ and the terminal T1 is connected to the shunt inductor $L_{11}$. In the case 221c, only the terminal T1 is connected to shunt capacitor $C_{11}$ and the terminal T2 is connected to the shunt inductor $L_{12}$. In the case 221d, both the terminals T1 and T2 are connected to shunt inductors $L_{11}$ and $L_{12}$, respectively. It should be noted that, the inductors (e.g., $L_{11}/L_{12}$) are used to explain the topology of the impedance inverter 221, but the invention is not limited thereto. The inductors can be replaced by the transmission line as mentioned in the embodiments of FIG. 3B.

In some embodiments, the impedance inverting network IIN can be implemented a quarter wave transmission line. At the fundamental frequency, the value of the common load $Z_L$ is selected to be equal to half of a fundamental impedance at the intrinsic plane of the main transistor TR1 and the quarter wave transmission line is sized to have the characteristics impedance equal to the fundamental impedance at the intrinsic plane of the main transistor TR1.

The design criteria for the harmonic termination circuits 222 and 223 are similar to that shown in FIG. 3C, thus will not be further repeated herein.

For the Doherty power amplifier (e.g., 200), the fundamental matching network is not used at all for both main and peaking transistors TR1 and TR2, causing circuit miniaturization and also solving the bandwidth limitations which comes from using a complex fundamental matching network for main and peaking transistors TR1 and TR2.

The Fully hybrid Integrated matching circuit uses both main and peaking transistor output parasitic capacitance (drain to source capacitance $C_{DS}$, Miller capacitance between the drain and source of the devices) and output parasitic inductance, for impedance inverting load modulating network design and also providing harmonic load terminations such as second and third harmonic, (class F, $F^{-1}$, J or continuum class F, $F^{-1}$, J) for main and or peaking device operating as switch mode power amplifier.

All the cases mentioned above provide the unique fully hybrid integrated matching circuit 220 which provide not only load modulation but also very high efficiency using the switch mode power amplifier over a wide bandwidth. The Fully hybrid Integrated matching circuit is also compact in size without using any fundamental matching network or offset lines and provides circuit miniaturization which is crucial for Radio Frequency Integrated Circuits (RFIC) applications.

FIGS. 4C and 4D are schematic circuit diagrams of a RF power amplifier having a one-side hybrid integrated matching circuit according to some exemplary embodiments of FIG. 2B.

The One-Sided hybrid Integrated matching circuit uses either main transistor or peak transistor, but not both, output parasitic capacitance (drain to source capacitance $C_{DS}$, Miller capacitance between the drain and source of the devices) and output parasitic inductance (series drain inductance $L_{par}$), for impedance inverting load modulating network and also providing harmonic load terminations such as second and third harmonic, (class F, $F^{-1}$, J or continuum class F, $F^{-1}$, J) for main and or peaking device operating as switch mode power amplifier.

Refer to FIG. 4C, the Doherty power amplifier 200' includes the main transistor TR1, the peaking transistor TR2, and the one-side hybrid integrated matching circuit 220', in which the one-side hybrid integrated matching circuit 220' includes the impedance inverter 221, the harmonic termination circuit 222, and the parasitic cancellation circuit 227.

The present embodiment is similar to those described in FIG. 4A, and thus the similar part will not be further repeated. The difference, compared to FIG. 4A, is that only the main transistor parasitic $C_{DS1}$ and $L_{par1}$ are used for the impedance inverting network design, and the parasitic cancellation circuit is introduced to cancel out the effect of the output parasitic at the peaking side.

To be specific, the impedance inverting network is using only main transistor output parasitic $C_{DS1}$ and $L_{par1}$, along with the shunt reactance $X_i$ and $X_j$ and series connected transmission circuit TC. The shunt reactance $X_i$ can be capacitive or inductive, based on the relationship of the main device parasitic capacitance $C_{DS1}$ and equivalent shunt capacitance value used of the low pass impedance inverting network.

The parasitic cancellation circuit 227 is connected between the drain terminal of the peaking transistor TR2 and the RF ground GND and configured to cancel out the effect of the parasitic component $C_{DS2}$ and $L_{par2}$ at the drain electrode of the peaking transistor TR2, and wherein the parasitic cancellation circuit 227 is an inductive type shunt component.

For example, the parasitic cancellation circuit 227 includes a shunt reactance $X_{CF}$ connected to the drain terminal of the peaking transistor TR2 to cancel out the effect of the peaking transistor output parasitic $C_{DS2}$ and $L_{par2}$ at the fundamental frequency.

Since the output parasitic of the peaking transistor TR2 has been cancelled by the shunt reactance $X_{CF}$, the impedance inverting network using only main transistor output parasitic can be regarded as the same as the impedance inverting network shown in FIG. 3B, which the shunt capacitor $C_{12}$ has the capacitance irrelevant to the peaking transistor output parasitic.

In the present embodiment, the parasitic cancellation circuit 227 can contributes as a part of the harmonic matching network for peaking transistor TR 2 if the peaking transistor is terminated with a harmonic terminating network as shown in FIG. 3C.

Refer to FIG. 4D, the Doherty power amplifier 200" includes the main transistor TR1, the peaking transistor TR2, and the one-side hybrid integrated matching circuit 220", in which the one-side hybrid integrated matching circuit 220"

includes the impedance inverter 221, the harmonic termination circuit 223, and the parasitic cancellation circuit 226.

The present embodiment is similar to those described in FIG. 4C, and thus the similar part will not be further repeated. The difference, compared to FIG. 4C, is that the peaking transistor parasitic $C_{DS2}$ and $L_{par2}$ are used for the impedance inverting network design, and the parasitic cancellation circuit is changed to cancel out the effect of the output parasitic at the main side.

To be specific, the impedance inverting network is using only peaking device output parasitic $C_{DS2}$ and $L_{par2}$, along with the shunt reactance $X_i$ and $X_j$ and series connected transmission circuit TC. The shunt reactance $X_j$ can be capacitive or inductive, based on the relationship of the peaking device parasitic capacitance $C_{DS2}$ and equivalent shunt capacitance value used of the low pass impedance inverting network.

The parasitic cancellation circuit 226 is connected between the drain terminal of the main transistor TR1 and the RF ground GND and configured to cancel out the effect of the parasitic component $C_{DS1}$ and $L_{par1}$ at the drain electrode of the main transistor TR1, and wherein the parasitic cancellation circuit 226 is an inductive type shunt component.

Since the effect of the output parasitic of the main transistor TR1 has been cancelled by the shunt reactance $X_{CF}$, the impedance inverting network using only peaking transistor output parasitic can be regarded as the same as the impedance inverting network shown in FIG. 3B, by exchanging the definition of the terminals T1 and T2.

In the present embodiment, the parasitic cancellation circuit 226 contributes as a part of the harmonic matching network for main transistor TR 1 if the main transistor is terminated with a harmonic terminating network as shown in FIG. 3C.

Figure 5A:
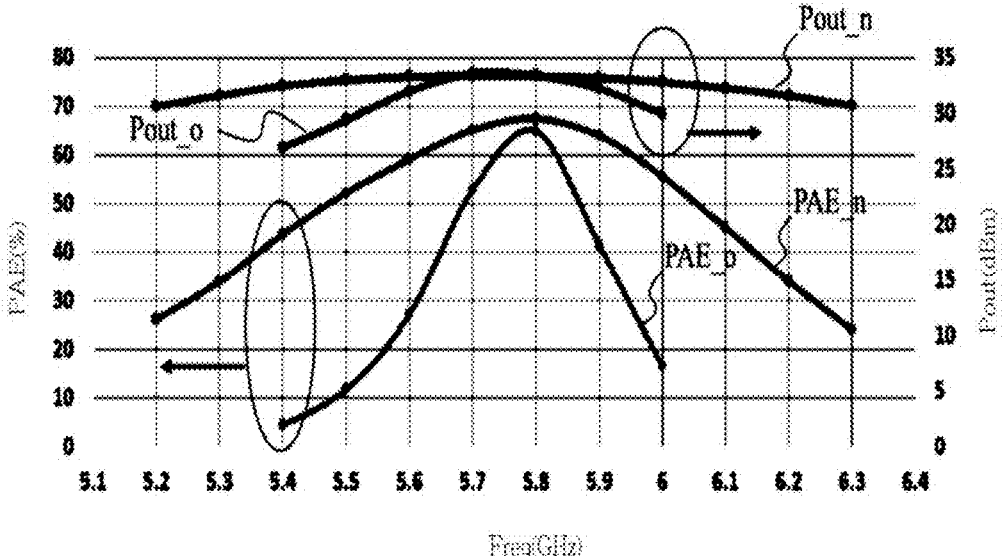
FIG. 5A is a performance chart of a comparison between typical Doherty power amplifier and a Doherty power amplifier having a hybrid integrated matching circuit.
Figure 5B:
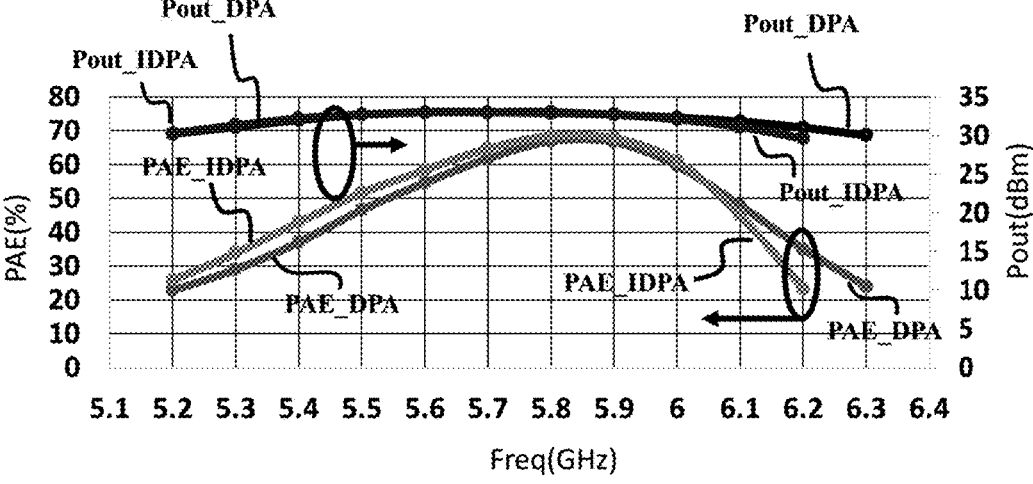
FIG. 5B is a performance chart of a comparison between classic/typical Doherty and inverted Doherty power amplifiers both using the hybrid integrated matching circuit.

FIG. 5 A is a performance chart of a comparison between typical Doherty power amplifier employing harmonic terminations and a Doherty power amplifier having a hybrid integrated matching circuit while FIG. 5 B is a performance chart of a comparison between the classic/typical Doherty and inverted Doherty power amplifiers both using the hybrid integrated matching circuit.

Refer to FIG. 5 A, which shows the comparison between one of the invented hybrid Integrated Matching circuit of the Doherty power amplifier 200 as shown in FIG. 2A employing harmonic load termination using second and third harmonic loads, (here its class F harmonic termination) with the typical Doherty power amplifier also employing second and third harmonic load terminations (here its class F harmonic termination) for high efficiency. The large signal simulation results at 6 dB back off from peak power of Doherty power amplifier, for frequency sweep, clearly shows that there has been a significant improvement in the bandwidth by using the invented Doherty power amplifier compared to conventional. The peak power of both the invented and conventional Doherty power amplifier are kept constant for fair comparison. It is pointed out that the same improvement is seen when using other hybrid Integrated Networks for comparison.

The invented circuit gives 18-20% fractional bandwidth compared to the conventional circuit giving only 7-8% fractional bandwidth although both of them showed high 6 dB back off power added efficiency (about 66-68%) at operating frequency of 5.8 GHz with output power (around 33.4 dBm) using the GaN technology as an example to prove the importance of present invention. Technologies like III-V (GaAs or InP or GaN), Si, CMOS, SOI, SiGe and other semiconductor technology platform for MMIC, hybrid IC or discrete applications can also be used. The 6 dB back off power added efficiency curve PAE_n of the invented Doherty power amplifier and 6 dB back off power added efficiency curve PAE_o of the conventional Doherty power amplifier shows the remarkable difference with respect to the frequency sweep. The same is seen for 6 dB back off output power curve Pout_n of the invented Doherty power amplifier and 6 dB back off output power curve Pout_o of the conventional Doherty power amplifier with respect to frequency sweep.

In addition, corresponding to the input power back-off, the perfect 6 dB output power back off is provided for load modulation with Power Added Efficiency (PAE) hitting maximum value of 68.343%. The output power provides 38.933 dBm power at peak power and 32.881 dBm power at 6 dB back off from peak power. The power gain can be 7.31 dB gain at peak power and 9.294 dB gain at 6 dB back off from peak power.

The main transistor intrinsic drain voltage reaches the peak value of 55.618 V (almost twice the drain bias voltage for class F design) and has an almost square wave shape while the main transistor intrinsic drain current reaches peak value of 0.24 A and is almost half sinusoidal at 6 dB back off operation of Doherty power amplifier. The main transistor dynamic load line plotted against the DC load line shows the classical class F load line biased in class AB mode at 28 V. The peak transistor is about to turn on as its drain current peak is at 0.038 A and the dynamic load line biased in class C mode at 28 V is about to rise.

The main transistor intrinsic drain voltage peak value is 57.87 V (almost twice the drain bias voltage for class F design) and has an almost square wave shape while the main transistor intrinsic drain current reaches peak value of 0.55 A and is almost half sinusoidal with certain harmonics which started coming after peak power operation of Doherty power amplifier due to gain compression. The main transistor dynamic load line plotted against the DC load line shows the classis class F load line at peak operation of Doherty power amplifier biased in class AB mode at 28 V. The peak transistor intrinsic drain voltage has a peak value about 63.032 V (almost twice the peak drain bias voltage for class F design) and has an almost square wave shape while the peak transistor intrinsic drain current reaches peak value of 0.5 A and is almost half sinusoidal with certain harmonics which started coming after peak power operation due to gain compression. The peak transistor dynamic load line plotted against the DC load line curve shows close approximation to classical class F load line at peak operation of Doherty power amplifier biased in class C mode at 28 V.

Figure 9A:
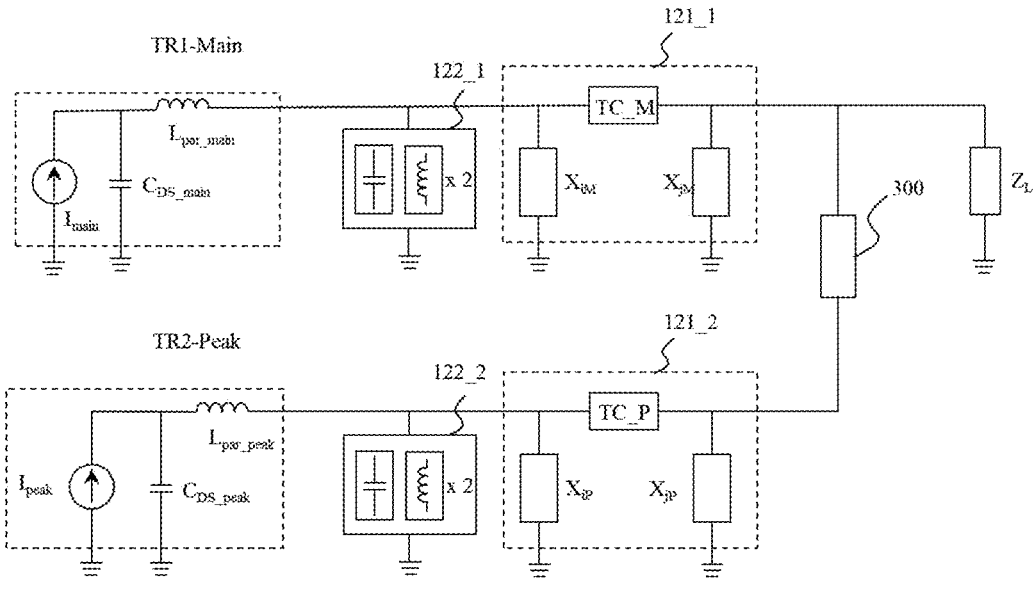
FIGS. 9A-9E are schematic circuit diagrams of a Doherty power amplifier according to some exemplary embodiments of FIGS. 8A-8E.
Figure 9B:
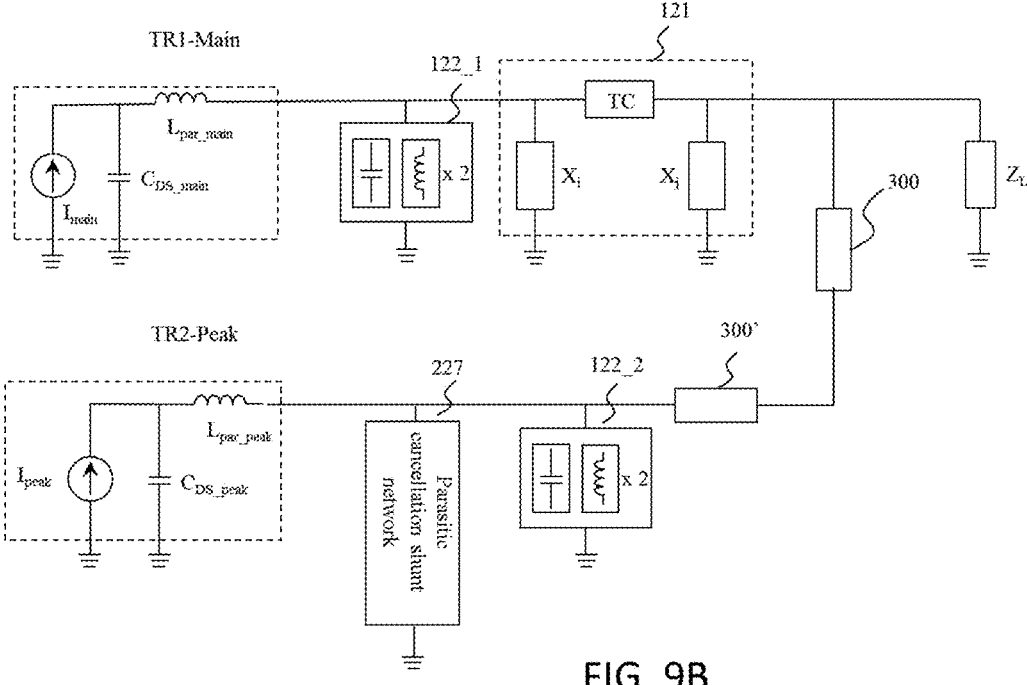
Figure 9C:
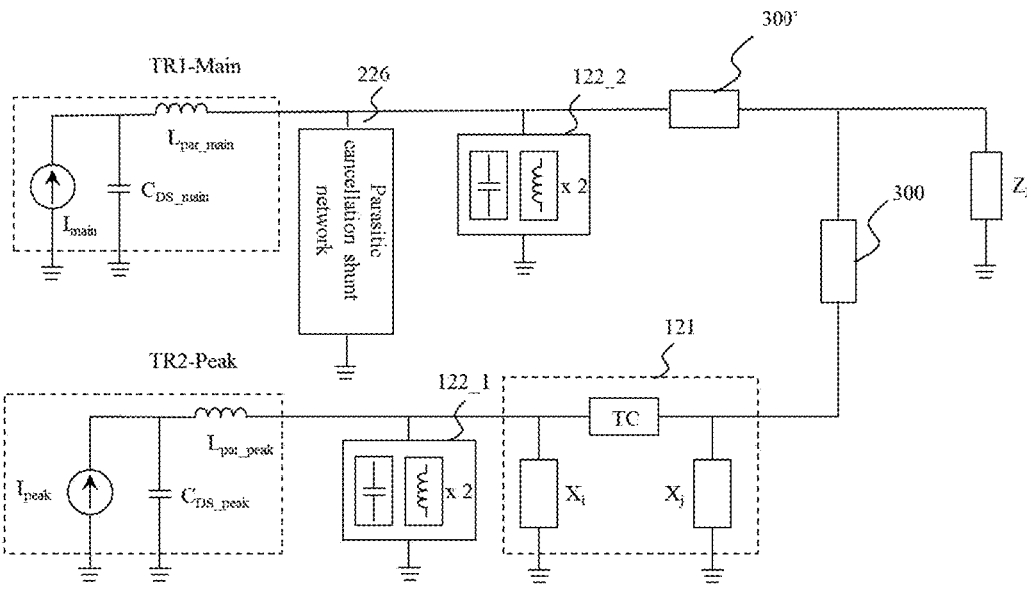
Figure 9D:
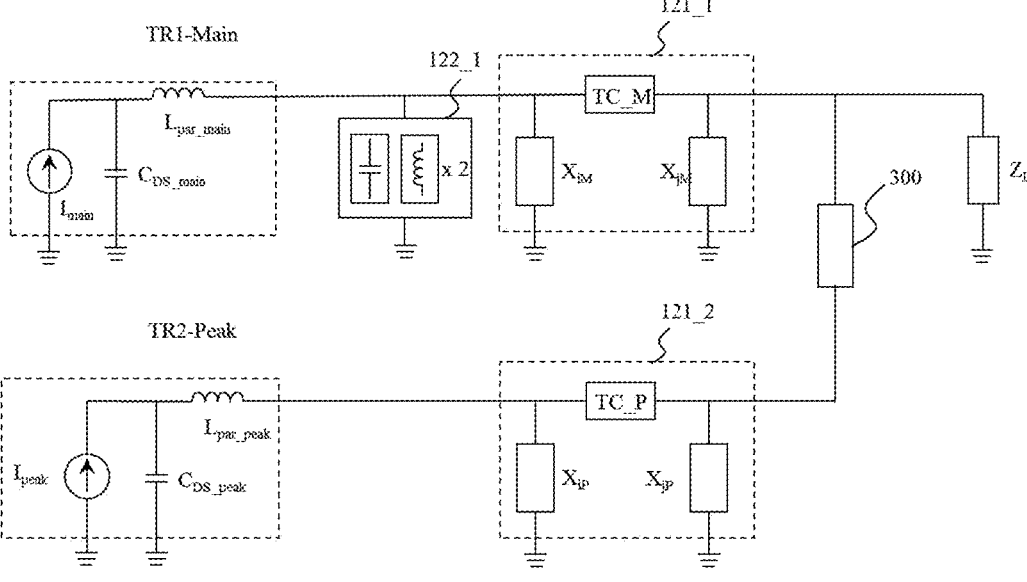
Figure 9E:
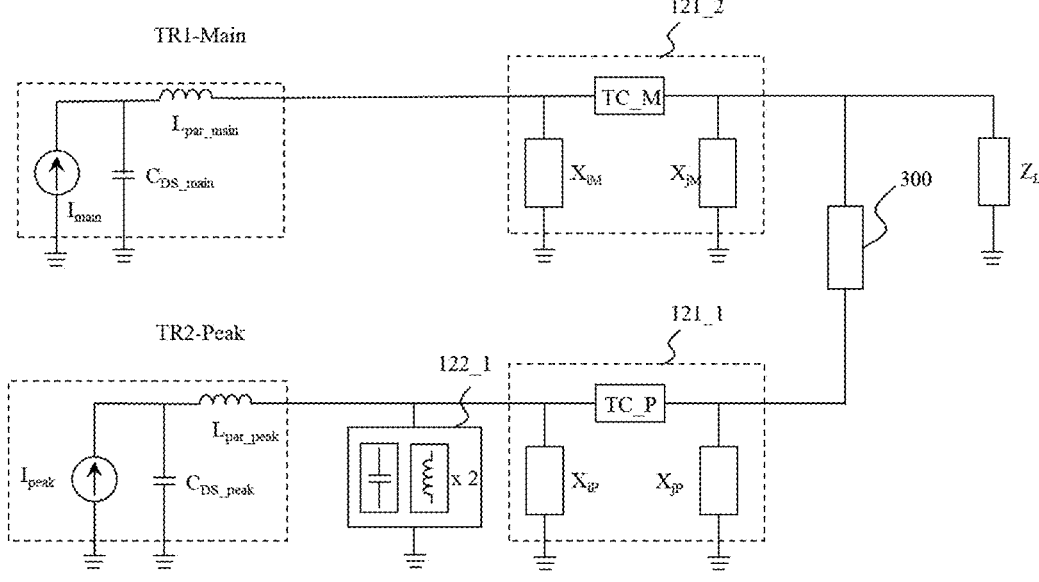

Refer to FIG. 5 B, which shows the comparison between one of the invented One-sided hybrid Integrated Matching circuit of the Doherty power amplifier 200 as shown in FIG. 2A with one of the invented One-sided hybrid integrated matching circuits as shown in FIG. 9A for Inverted Doherty power amplifier, both employing harmonic load termination using second and third harmonic loads, (here its class F harmonic termination). The large signal simulation results at 6 dB back off from peak power of both Doherty power amplifier and Inverted Doherty power amplifier shows the similar improvements in Bandwidth around 20% for both. However, the PAE at 6 dB back off for inverted Doherty power amplifier (PAE_IDPA) is around 68.5% while for classic Doherty power amplifier (PAE_DPA) is around 66.5% at the operating frequency. The slight increase in efficiency is due to low leakage of the current from main amplifier to peak amplifier during the back-off operation of the inverted Doherty power amplifier. Pout_IDPA and Pout__DPA of the inverted Doherty power amplifier and classical/typical Doherty power amplifier shows similar 3 dB fractional bandwidth. Note that these results can vary depending on the proper design of the components and does not provide any generic conclusions in the comparison of inverted and classic Doherty power amplifier using the hybrid integrated matching circuits according to the present disclosure.

FIG. 6 is a flow chart of a method for manufacturing a Doherty power amplifier.

Refer to FIG. 6, the method for manufacturing a Doherty power amplifier can manufacture the Doherty power amplifier mentioned in the present disclosure. The method includes the following steps: providing at least one main amplifier operated at a fundamental frequency (S110), providing at least one peaking amplifier connected to the main amplifier in parallel and sharing a common load or a load (S120); connecting a first hybrid integrated matching circuit between output terminals of the at least one main amplifier and the at least one peaking amplifier (S130).

When connecting the first hybrid integrated matching circuit (S130), a first circuit can be connected between the output terminals of the at least one main amplifier and the at least one peaking amplifier. The first circuit contributes as a part of an impedance inverting network of the first hybrid integrated matching circuit of the Doherty power amplifier.

More specifically, when connecting the first hybrid integrated matching circuit (S130), the following steps can also be taken: connecting a second circuit between the output terminal of the at least one main amplifier and a RF ground; connecting a third circuit between the output terminal of the at least one peaking amplifier and the RF ground; determining the size and the type of components included in the first circuit so as to design the impedance inverting network using an output parasitic component of at least one of the main amplifier and the peaking amplifier at the fundamental frequency; determining the size of components included in the second circuit and the third circuit so that the second circuit and the third circuit presents a high impedance relative to the RF ground at the fundamental frequency hence not affecting the functioning of the impedance inverting network; and determining the size of the components included in the second circuit and the third circuit so as to terminate at least one of a second harmonic and a third harmonic of the fundamental frequency by using at least the first circuit, the second circuit, and the third circuit presenting impedances such that one of a low impedance and a high impedance is observed from an intrinsic plane of the main amplifier and peaking amplifier corresponding to that harmonic frequency.

Figure 10:
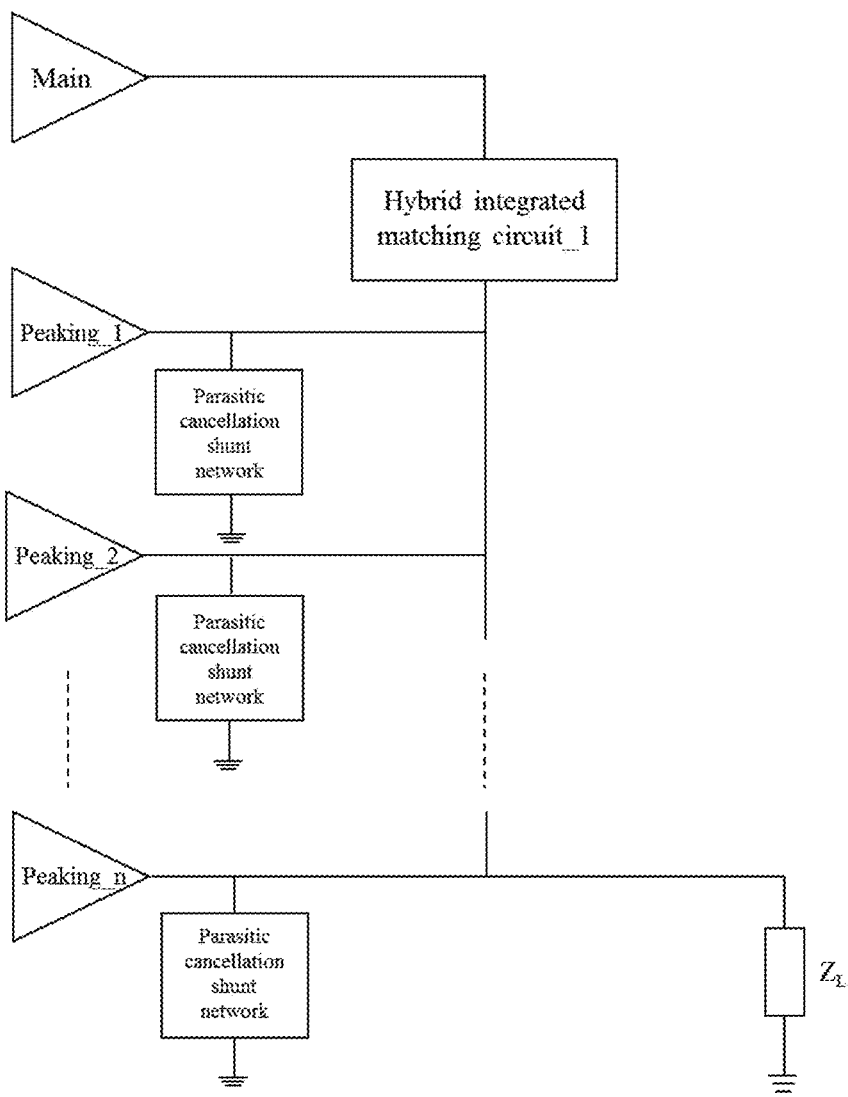
FIG. 10 is a block diagram of an N-way Doherty power amplifier according to some exemplary embodiments of the present disclosure.

In addition, the step providing the at least one peaking amplifier (S120) of the method can be providing at least two peaking amplifiers. The method can further comprise: connecting a parasitic cancellation shunt network between the output terminal of each of the at least two peaking amplifiers and the RF ground. Accordingly, the method can also be used to manufacture a N-way Doherty power amplifier as shown in FIG. 10.

Refer to FIG. 7, the method for manufacturing a Doherty power amplifier can manufacture, in particular, the inverted Doherty power amplifier mentioned in the present disclosure. The method includes the following steps: providing at least one main amplifier operated at a fundamental frequency (S210), providing at least one peaking amplifier connected to the main amplifier in parallel and sharing a common load or a load (S220); connecting a first hybrid integrated matching circuit between output terminals of the at least one main amplifier and the at least one peaking amplifier (S230); connecting a second hybrid integrated matching circuit or an additional impedance inverting network and a parasitic cancellation shunt network between output terminals of the at least one main amplifier and the at least one peaking amplifier (S240). In the method, the first hybrid integrated matching circuit and the second hybrid integrated matching circuit, or the first hybrid integrated matching circuit, the additional impedance inverting network and the parasitic cancellation shunt network are connected together by an impedance inverting network and sharing the common load.

In the method, the first hybrid integrated matching circuit and the second hybrid integrated matching circuit are connected together by an impedance inverting network and sharing the common load. The impedance inverting network prevents the leakage of the signal from between the two transistors when one of the transistors is turned off. The impedance inverting network can be at least one of the following topologies: a quarter wave transformer, a high pass $n^{th}$ order quarter wave transformer, a low pass $n^{th}$ order quarter wave transformer, a low pass $n^{th}$ stage lumped quarter wave transformer, a high pass $n^{th}$ stage lumped quarter wave transformer a reduced length quarter wave transmission line, a quasi-lumped $n^{th}$ order low pass filter, a quasi-lumped $n^{th}$ order high pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, a quasi-lumped $n^{th}$ order high pas quarter wave transformer, a quasi-lumped high pass Chebyshev transformer, a quasi-lumped high pass Chebyshev quarter wave transformer, quasi-lumped high pass quarter wave stepped impedance transformer and a quasi-lumped high pass quarter wave stepped impedance quarter wave transformer, a combination of low pass and high pass lumped or distributed quarter wave transformer.

When connecting the first hybrid integrated matching circuit (S230), a first circuit can be connected between the output terminals of the at least one main amplifier and the at least one peaking amplifier. The first circuit of the first hybrid integrated matching circuit contributes as a part of an impedance inverting network of the first hybrid integrated matching circuit of the Doherty power amplifier. When connecting the second hybrid integrated matching circuit (S240), a first circuit can also be connected between the output terminals of the at least one main amplifier and the at least one peaking amplifier. The first circuit of the second hybrid integrated matching circuit contributes as a part of an impedance inverting network of the second hybrid integrated matching circuit of the Doherty power amplifier.

Figure 8A:
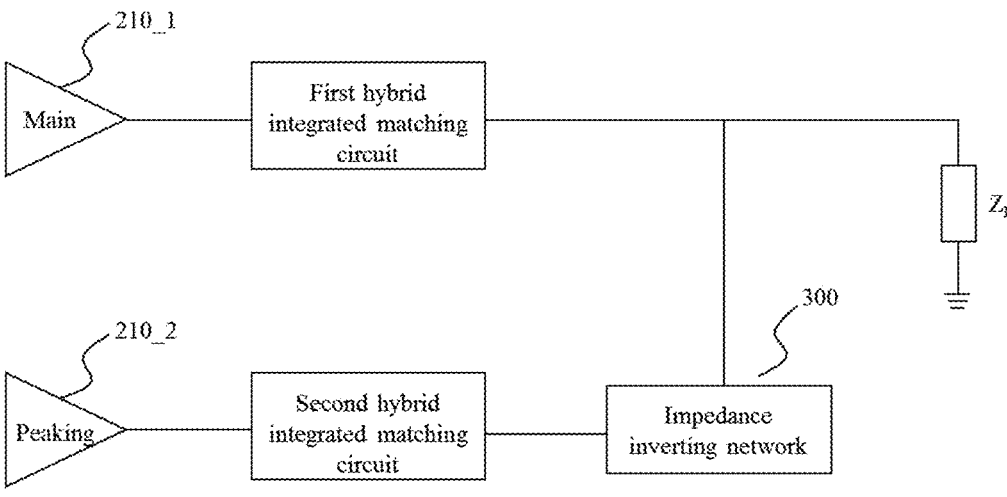
FIGS. 8A-8E are block diagrams of a Doherty power amplifier according to some exemplary embodiments of the present disclosure.
Figure 8B:
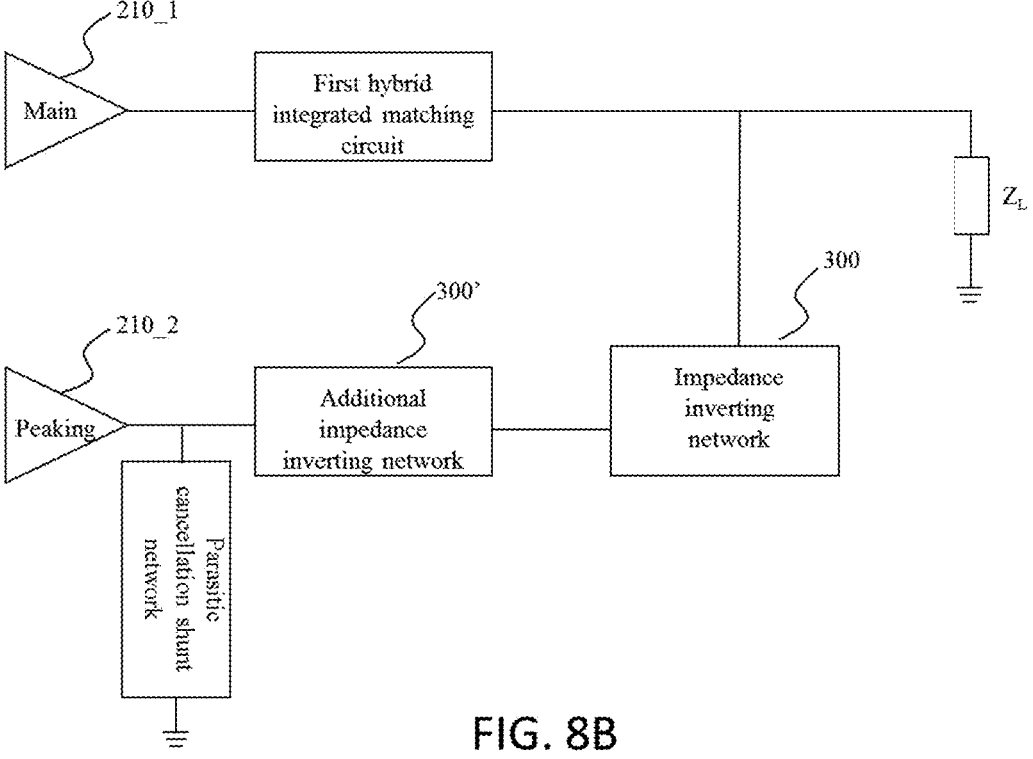
Figure 8C:
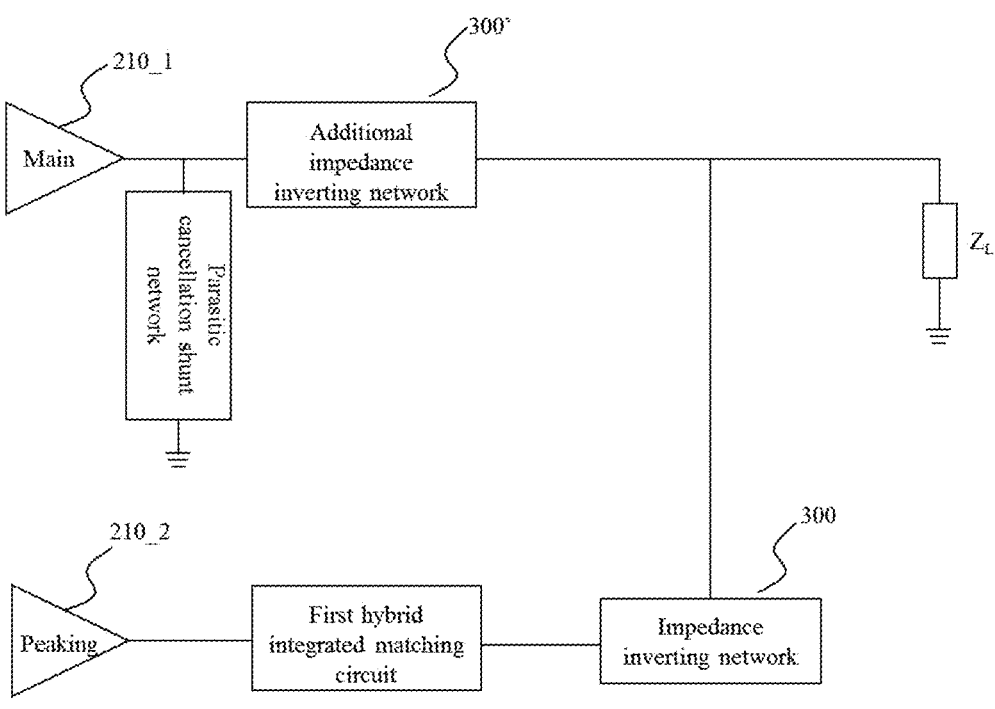
Figure 8D:
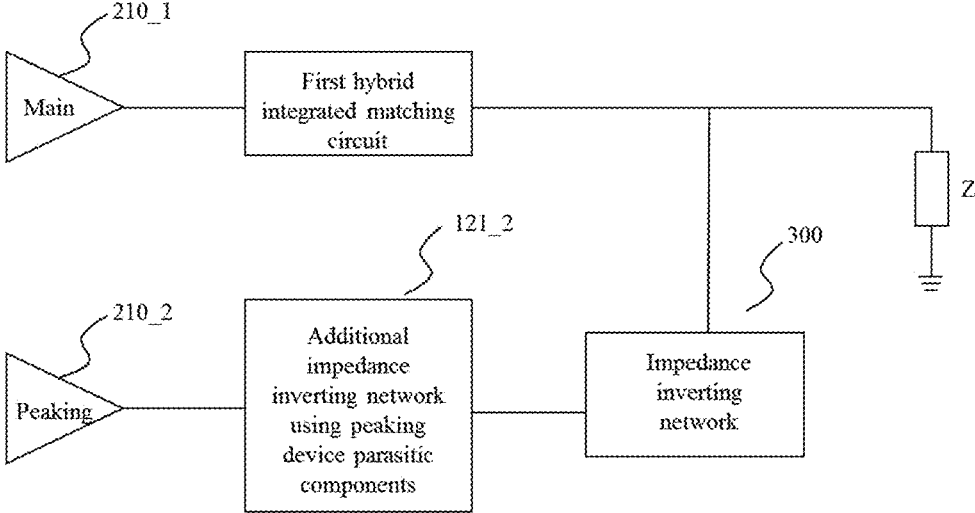
Figure 8E:
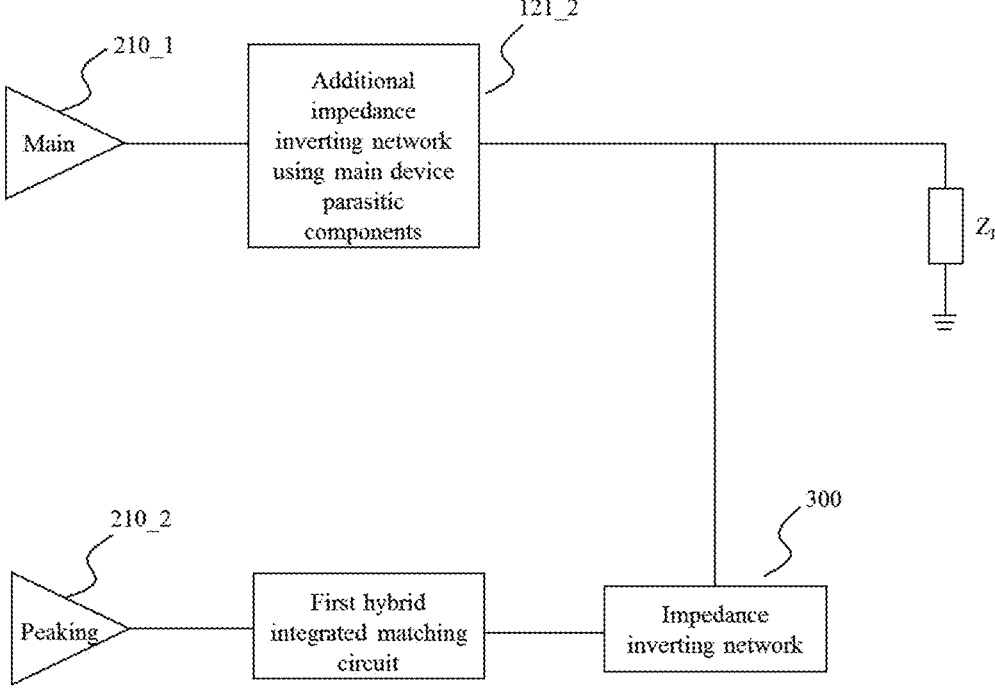

According to the method shown in FIG. 7, the Doherty (namely, inverted Doherty) power amplifier in FIG. 8A, 8B, 8C, 8D or 8E can be manufactured. The impedance inverting network 300 details are already explained before in FIG. 7 detailed explanation and hence will not be repeated again. The additional impedance inverting network 300' is used as output matching for at least one of the main or peaking amplifiers when the hybrid integrated matching circuit is not used for at least one of the main or peaking amplifiers. The topology which can be used for designing the additional impedance inverting network 300' is similar to impedance inverting network 300 and hence will not be repeated here. Also note that if the additional impedance inverting network used the device parasitic then it becomes a part of the hybrid integrated matching circuit as shown in FIGS. 8D and 8E. FIGS. 9A, 9B, 9C, 9D and 9E respectively shows the construction of FIGS. 8A, 8B, 8C, 8D and 8E in detail. Components with similar numbers provides similar functions as mentioned in the foregoing embodiments. Illustrations are hereby omitted.

In addition, the step providing the at least one peaking amplifier (S220) of the method can be providing at least two peaking amplifiers. The method can further comprise: connecting at least one additional hybrid integrated matching circuit between output terminals of the at least two peaking amplifiers such that each of the at least two peaking amplifiers is associated with one hybrid integrated matching circuit, wherein the first hybrid integrated matching circuit, the second hybrid integrated matching circuit and the at least one additional hybrid integrated matching circuit are connected together by the impedance inverting networks and sharing the common load. The step connecting the at least one additional hybrid integrated matching circuit comprises connecting a first circuit between the output terminals of the at least two peaking amplifiers, wherein the first circuit contributes as a part of an impedance inverting network of the at least one additional hybrid integrated matching circuit of the Doherty power amplifier. Accordingly, the method can also be used to manufacture a three-way Doherty power amplifier as shown in FIG. 11 and even an N-way Doherty power amplifier as shown in FIG. 12.

Figure 11:
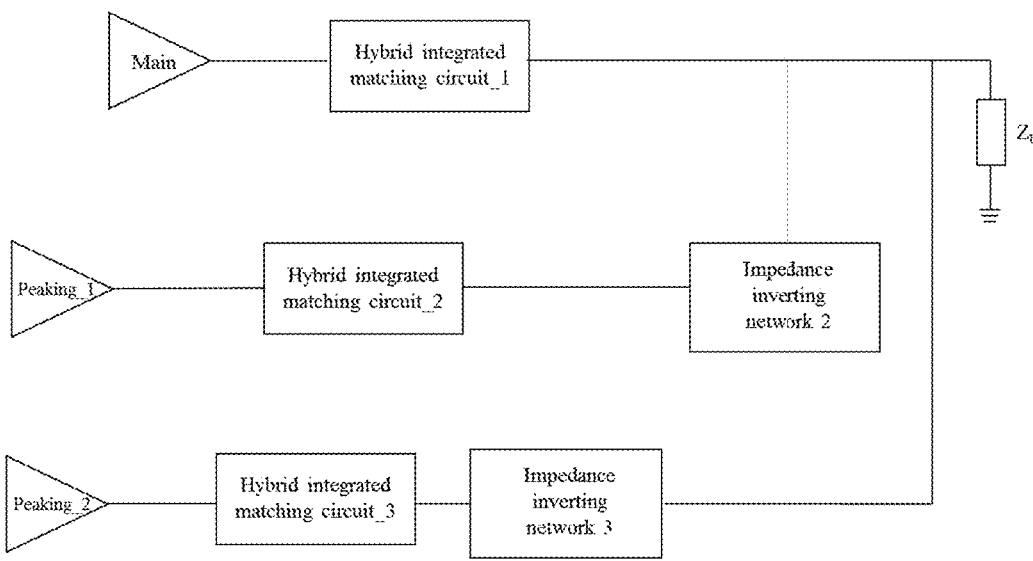
FIG. 11 is a block diagram of a three-way Doherty (namely, inverted Doherty) power amplifier according to some exemplary embodiments of the present disclosure.
Figure 12:
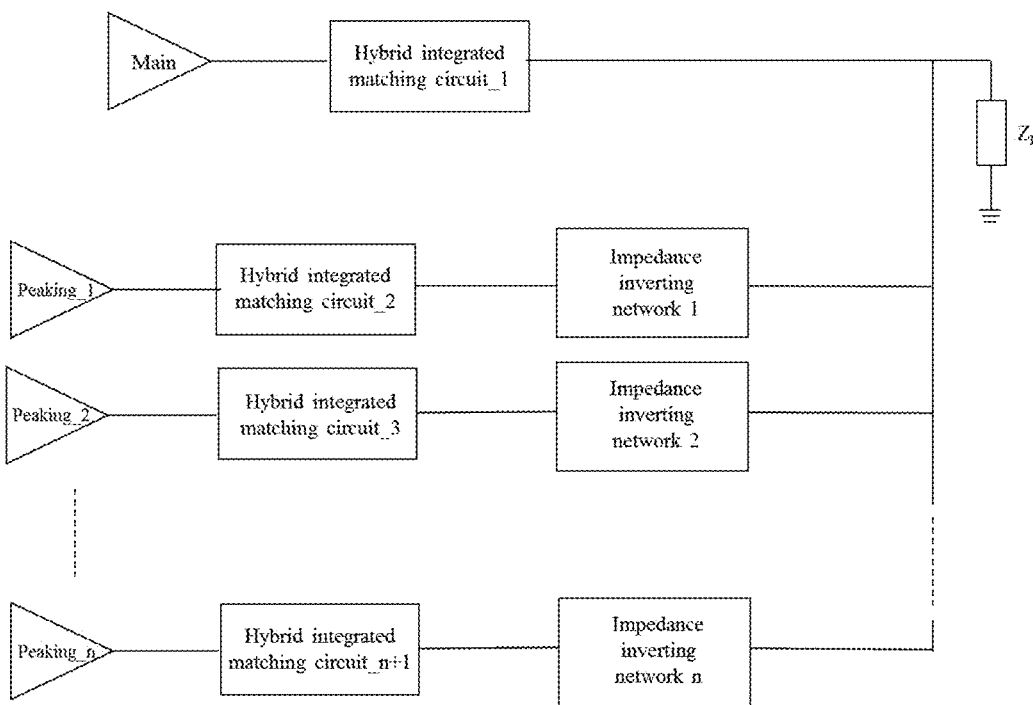
FIG. 12 is a block diagram of an N-way Doherty (namely, inverted Doherty) power amplifier according to some exemplary embodiments of the present disclosure.
Figure 13:
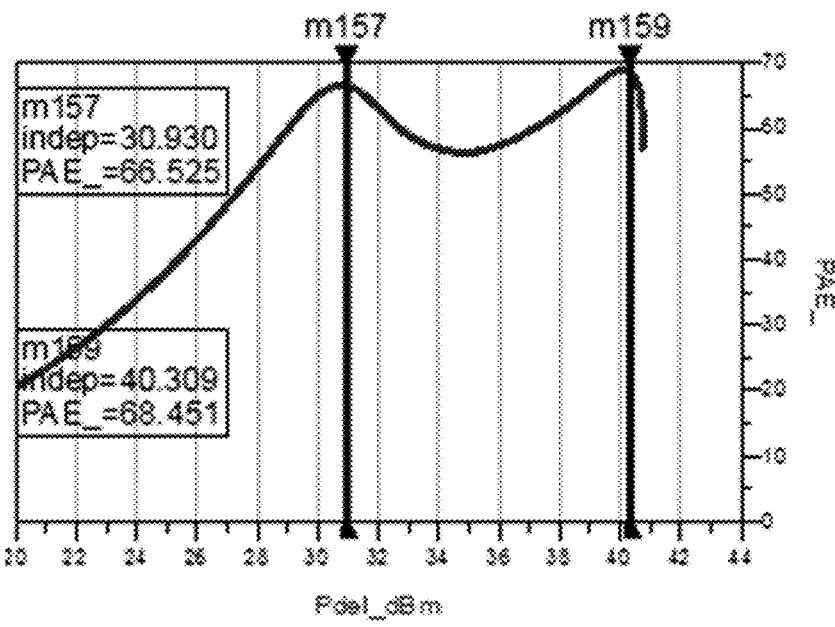
FIG. 13 is a performance chart of the three-way Doherty power amplifier as shown in FIG. 11.

The three-way and the N-way Doherty power amplifiers as shown in FIGS. 11 and 12 are namely three-way and N-way inverted Doherty power amplifiers. FIG. 13 shows the performance chart of the three-way Doherty power amplifier as shown in FIG. 11. In FIG. 13, two peaks of efficiency are identified with a back off at about 9 dB.

In both methods mentioned above, connecting the at least one additional hybrid integrated matching circuit comprises connecting a second circuit between the output terminals of the at least two peaking amplifiers. The second circuit is configured to present an impedance relative to a RF ground at a fundamental frequency and that at least one of the second harmonic and third harmonic of the fundamental frequency is terminated.

A method for manufacturing a three-stage Doherty power amplifier mentioned in the present disclosure is also provided. The method includes the following steps: providing a main amplifier operated at a fundamental frequency; providing a first peaking amplifier and a second peaking amplifier connected to the first peaking amplifier in parallel, with the first and second peaking amplifiers connected to the main amplifier in parallel via an impedance inverting network and sharing a common load or a load; connecting a first hybrid integrated matching circuit between output terminals of the main amplifier and the first and second peaking amplifiers; connecting a second hybrid integrated matching circuit between output terminals of the main amplifier and the first and second peaking amplifiers, with the first hybrid integrated matching circuit and the second hybrid integrated matching circuit connected together by the impedance inverting network and sharing the common load.

In the above method, a third hybrid integrated matching circuit can be connected between output terminals of the first peaking amplifier and the second peaking amplifier, and the second hybrid integrated matching circuit and the third hybrid integrated matching circuit are connected together by another impedance inverting network and sharing the common load. Furthermore, when connecting the third hybrid integrated matching circuit, a first circuit can be connected between the output terminals of the first peaking amplifier and the second peaking amplifier, with the first circuit contributing as a part of an impedance inverting network of the third hybrid integrated matching circuit of the Doherty power amplifier.

Alternatively, a parasitic cancellation shunt network can be connected between output terminals of the first peaking amplifier and the second peaking amplifier and a RF ground.

Figure 15:
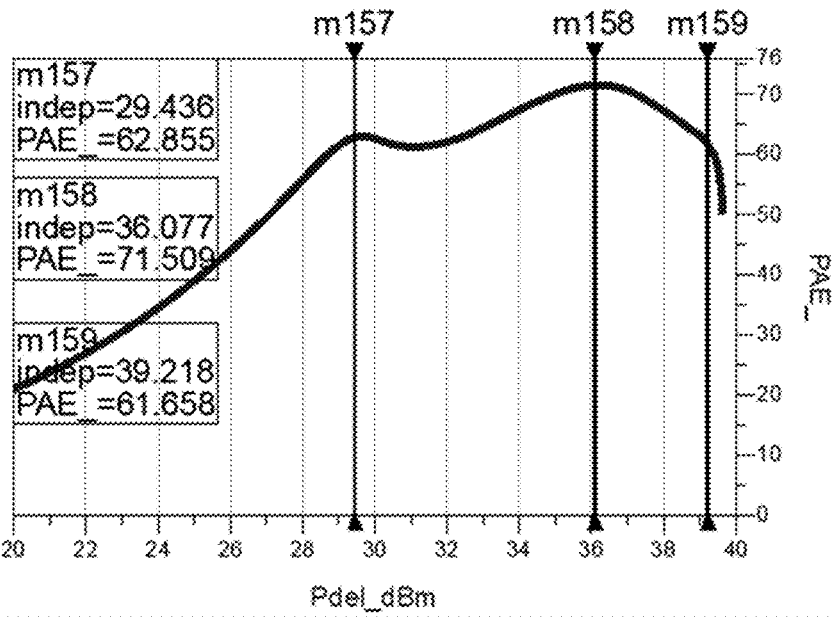
FIG. 15 is a performance chart of the three-stage Doherty power amplifier as shown in FIG. 14B.
Figure 14A:
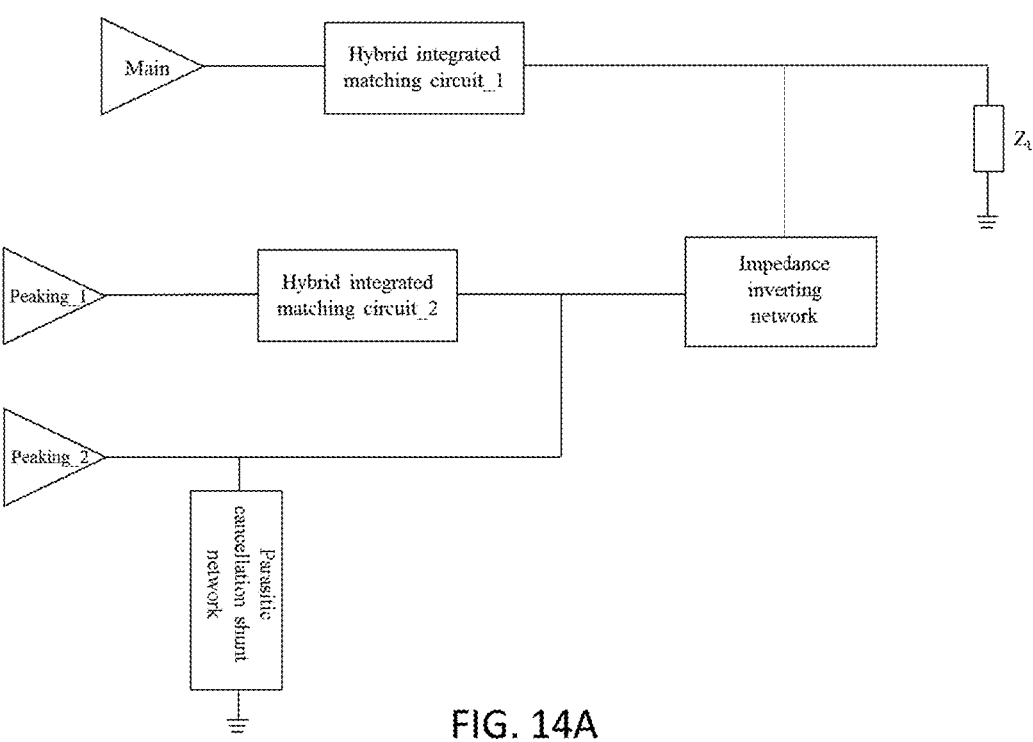
FIGS. 14A and 14B are block diagrams of different variations of a three-stage Doherty power amplifier according to some exemplary embodiments of the present disclosure.
Figure 14B:
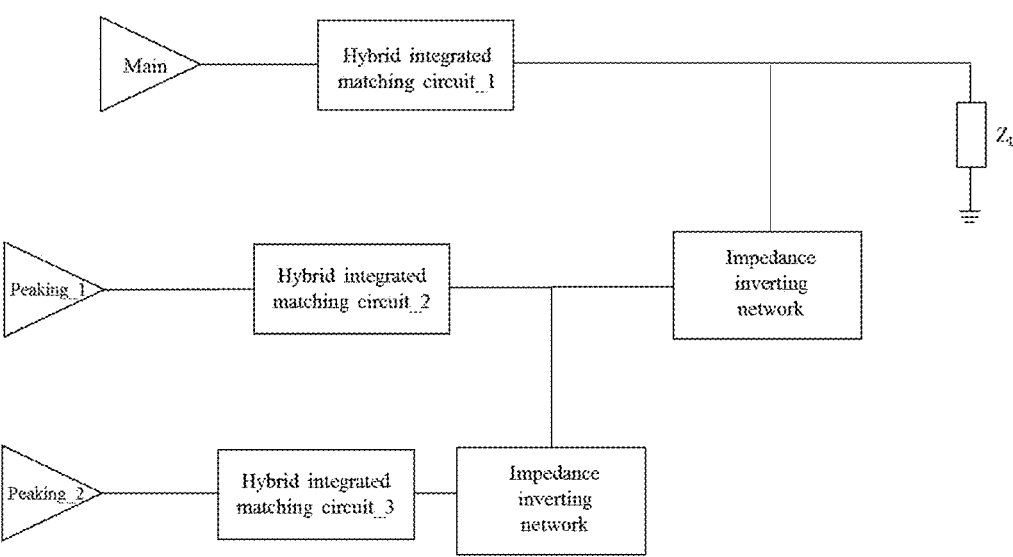

According to the above method, a three-stage Doherty power amplifier as shown in FIG. 14A or another variation of the three-stage Doherty power amplifier as shown in FIG. 14B can be manufactured. FIG. 15 shows the performance chart of the three-stage Doherty power amplifier as shown in FIG. 14B. In FIG. 15, the three-stage Doherty power amplifier has three peaks of efficiency at certain back off from each other. The first efficiency peak is around 10 dB back off and the second efficiency peak is around 6 dB back off from the third efficiency peak which is the efficiency at peak power operation of the amplifier.

In the above method, the step connecting the first hybrid integrated matching circuit comprises connecting a first circuit between the output terminals of the main amplifier and the first and second peaking amplifiers. The first circuit contributes as a part of an impedance inverting network of the first hybrid integrated matching circuit of the Doherty power amplifier. The step connecting the second hybrid integrated matching circuit comprises connecting a first circuit between the output terminals of the main amplifier and the first peaking amplifier. The first circuit contributes as a part of an impedance inverting network of the second hybrid integrated matching circuit of the Doherty power amplifier. The step connecting the third hybrid integrated matching circuit comprises connecting a first circuit between the output terminals of the first peaking amplifier and the second peaking amplifier. The first circuit contributes as a part of an impedance inverting network of the third hybrid integrated matching circuit of the Doherty power amplifier.

In the above method, the impedance inverting network prevents the leakage of the signal from between the two transistors when one of the transistors is turned off. The characteristics impedance of the impedance inverting network can be optimized for bandwidth and efficiency peaks of power amplifier. The impedance inverting network can be at least one of the following topologies: a quarter wave transformer, a high pass $n^{th}$ order quarter wave transformer, a low pass $n^{th}$ order quarter wave transformer, a low pass $n^{th}$ stage lumped quarter wave transformer, a high pass $n^{th}$ stage lumped quarter wave transformer a reduced length quarter wave transmission line, a quasi-lumped $n^{th}$ order low pass filter, a quasi-lumped $n^{th}$ order high pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, a quasi-lumped $n^{th}$ order high pass quarter wave transformer, a quasi-lumped high pass Chebyshev transformer, a quasi-lumped high pass Chebyshev quarter wave transformer, quasi-lumped high pass quarter wave stepped impedance transformer and a quasi-lumped high pass quarter wave stepped impedance quarter wave transformer, a combination of low pass and high pass lumped or distributed quarter wave transformer.

In addition, each of the impedance inverting network of the second and the third hybrid integrated matching circuits in the above method is constructed with an impedance inverter with at least one of the following topologies: a low pass $n^{th}$ stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer.

The three-way and three-stage Doherty power amplifiers according to the above embodiments are different in the way that three-way Doherty power amplifier has only two peaks of efficiency with certain back off there between typically 9 dB, while the three-stage Doherty power amplifier has three peaks of efficiency at certain back off from each other typically 9 dB and 6 dB. According to the present invention, the three-stage or three-way Doherty power amplifier can be easily manufactured using the hybrid integrated matching circuits which helps to reduce the size, enhance the bandwidth, increase efficiency using multiple harmonic terminations and provide practical designs for future RF solutions.

It is also worth noting that the three-stage Doherty power amplifier uses impedance inverting networks whose characteristics impedance can be adjusted for providing the desired three peaks and required bandwidth based on the common load value.

The above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:

1. A method for manufacturing a Doherty power amplifier, comprising:
   providing at least one main amplifier operated at a fundamental frequency;
   providing at least one peaking amplifier connected to the at least one main amplifier in parallel and sharing a common load or a load;
   connecting a first hybrid integrated matching circuit between output terminals of the at least one main amplifier and the at least one peaking amplifier, wherein connecting the first hybrid integrated matching circuit comprises:
   connecting a first circuit between the output terminals of the at least one main amplifier and the at least one peaking amplifier, wherein the first circuit contributes as a part of an impedance inverting network of the first hybrid integrated matching circuit of the Doherty power amplifier, and wherein at the fundamental frequency, the first circuit and an output parasitic component of at least one of the at least one main amplifier and the at least one peaking amplifier operate as an impedance inverter;
   connecting at least one second circuit between a RF ground and the output terminal of at least one of the at least one main amplifier and the at least one peaking amplifier, wherein the second circuit is configured to present a high impedance relative to the RF ground at the fundamental frequency; and
   wherein the second circuit is further configured to present an impedance relative to the RF ground such that one of a high impedance and a low impedance is observed from an intrinsic plane of at least one of the at least one main amplifier and the at least one peaking amplifier at a first target harmonic of the fundamental frequency to terminate the first target harmonic.

2. The method for manufacturing the Doherty power amplifier as claimed in claim 1, wherein connecting the first hybrid integrated matching circuit further comprises:
   connecting a third circuit between the output terminal of the at least one peaking amplifier and the RF ground;
   determining the size of components included in the third circuit so that the third circuit presents a high impedance relative to the RF ground at the fundamental frequency hence not affecting the functioning of the impedance inverting network;
   determining the size of the components included in the second circuit and the third circuit so as to terminate one of a second harmonic and a third harmonic of the fundamental frequency by using at least the first circuit, the second circuit, and the third circuit presenting impedances such that one of a low impedance and a high impedance is observed from the intrinsic plane of at least one of the at least one main amplifier and the at least one peaking amplifier corresponding to that harmonic frequency.

3. The method for manufacturing the Doherty power amplifier as claimed in claim 2, wherein connecting the first hybrid integrated matching circuit further comprises:
   determining the size of the components included in the second circuit and the third circuit so as to terminate the other one of the second harmonic and the third harmonic of the fundamental frequency by using at least the first circuit, the second circuit, and the third circuit presenting impedances such that one of a high impedance and a low impedance is observed from the intrinsic plane of at least one of the at least one main amplifier and the at least one peaking amplifier corresponding to that harmonic frequency.

4. The method for manufacturing the Doherty power amplifier as claimed in claim 1, wherein the impedance inverting network of the first hybrid integrated matching is constructed with an impedance inverter with at least one of the following topologies: a low pass n-stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer;
   wherein n is a natural number.

5. The method for manufacturing the Doherty power amplifier as claimed in claim 2, wherein providing the at least one peaking amplifier includes providing at least two peaking amplifiers, and the method further comprises:
   connecting a parasitic cancellation shunt network between the output terminal of each of the at least two peaking amplifiers and the RF ground.

6. The method for manufacturing a Doherty power amplifier as claimed in claim 1, wherein the second circuit includes a circuit topology configured to make at least one of the at least one main amplifier and the at least one peaking amplifier operate in a class F, class F-1, class J, class E, continuum class F, continuum class F-1, continuum class J and class E.

7. A method for manufacturing a Doherty power amplifier, comprising:

providing at least one main amplifier operated at a fundamental frequency;

providing at least one peaking amplifier connected to the at least one main amplifier in parallel and sharing a common load or a load;

connecting a first hybrid integrated matching circuit between output terminals of the at least one main amplifier and the at least one peaking amplifier, wherein connecting the first hybrid integrated matching circuit comprises:

connecting a first circuit between the output terminals of the at least one main amplifier and the at least one peaking amplifier, wherein the first circuit contributes as a part of an impedance inverting network of the first hybrid integrated matching circuit of the Doherty power amplifier;

connecting a second hybrid integrated matching circuit or an additional impedance inverting network and a parasitic cancellation shunt network between output terminals of the at least one main amplifier and the at least one peaking amplifier, wherein the first hybrid integrated matching circuit and the second hybrid integrated matching circuit, or the first hybrid integrated matching circuit, the additional impedance inverting network and the parasitic cancellation shunt network are connected together by an impedance inverting network and sharing the common load, wherein connecting the second hybrid integrated matching circuit comprises:

connecting a first circuit between the output terminals of the at least one main amplifier and the at least one peaking amplifier, wherein the first circuit contributes as a part of an impedance inverting network of the second hybrid integrated matching circuit of the Doherty power amplifier.

8. The method for manufacturing the Doherty power amplifier as claimed in claim 7, wherein the impedance inverting network connecting the first and the second hybrid integrated matching circuit is configured to prevent leakage of signal from between transistors of the at least one main amplifier and the at least one peaking amplifier when any of the transistors is turned off, and wherein a characteristics impedance of the impedance inverting network is adjusted to optimize a bandwidth of the Doherty power amplifier.

9. The method for manufacturing the Doherty power amplifier as claimed in claim 7, wherein the impedance inverting network connecting the first and the second hybrid integrated matching circuit includes at least one of the following topologies: a quarter wave transformer, a high pass $n^{th}$ order quarter wave transformer, a low pass $n^{th}$ order quarter wave transformer, a low pass n-stage lumped quarter wave transformer, a high pass n-stage lumped quarter wave transformer a reduced length quarter wave transmission line, a quasi-lumped $n^{th}$ order low pass filter, a quasi-lumped $n^{th}$ order high pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, a quasi-lumped $n^{th}$ order high pass quarter wave transformer, a quasi-lumped high pass Chebyshev transformer, a quasi-lumped high pass Chebyshev quarter wave transformer, quasi-lumped high pass quarter wave stepped impedance transformer and a quasi-lumped high pass quarter wave stepped impedance quarter wave transformer, a combination of low pass and high pass lumped or distributed quarter wave transformer; wherein n is a natural number.

10. The method for manufacturing the Doherty power amplifier as claimed in claim 7, wherein the impedance inverting network of the second hybrid integrated matching circuit is constructed with an impedance inverter with at least one of the following topologies: a low pass n-stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer; wherein n is a natural number.

11. The method for manufacturing the Doherty power amplifier as claimed in claim 7, wherein providing the at least one peaking amplifier includes providing at least two peaking amplifiers, and the method further comprises:

connecting at least one additional hybrid integrated matching circuits between output terminals of the at least two peaking amplifiers such that each of the at least two peaking amplifiers is associated with one hybrid integrated matching circuit, wherein the first hybrid integrated matching circuit, the second hybrid integrated matching circuit and the at least one additional hybrid integrated matching circuit are connected together by the impedance inverting networks and sharing the common load, wherein connecting the at least one additional hybrid integrated matching circuit comprises:

connecting a first circuit between the output terminals of the at least two peaking amplifiers, wherein the first circuit contributes as a part of an impedance inverting network of the at least one additional hybrid integrated matching circuit of the Doherty power amplifier.

12. A method for manufacturing a Doherty power amplifier, comprising:

providing a main amplifier operated at a fundamental frequency;

providing a first peaking amplifier and a second peaking amplifier connected to the first peaking amplifier in parallel, wherein the first and second peaking amplifiers are connected to the main amplifier in parallel via an impedance inverting network and sharing a common load or a load;

connecting a first hybrid integrated matching circuit between output terminals of the main amplifier and the first and second peaking amplifiers, wherein connecting the first hybrid integrated matching circuit comprises:

connecting a first circuit between the output terminals of the main amplifier and the first and second peaking amplifiers, wherein the first circuit contributes as a part of an impedance inverting network of the first hybrid integrated matching circuit of the Doherty power amplifier;

connecting a second hybrid integrated matching circuit between output terminals of the main amplifier and the first or second peaking amplifier, wherein the first hybrid integrated matching circuit and the second hybrid integrated matching circuit are connected together by the impedance inverting network and sharing the common load, wherein connecting the second hybrid integrated matching circuit comprises:

connecting a first circuit between the output terminals of the main amplifier and the first peaking amplifier, wherein the first circuit contributes as a part of an impedance inverting network of the second hybrid integrated matching circuit of the Doherty power amplifier.

13. The method for manufacturing the Doherty power amplifier as claimed in claim 12, further comprising:

connecting a third hybrid integrated matching circuit between output terminals of the first peaking amplifier and the second peaking amplifier, wherein the second hybrid integrated matching circuit and the third hybrid integrated matching circuit are connected together by another impedance inverting network and sharing the common load.

14. The method for manufacturing the Doherty power amplifier as claimed in claim 13, wherein connecting the third hybrid integrated matching circuit comprises:

connecting a first circuit between the output terminals of the first peaking amplifier and the second peaking amplifier, wherein the first circuit contributes as a part of an impedance inverting network of the third hybrid integrated matching circuit of the Doherty power amplifier.

15. The method for manufacturing the Doherty power amplifier as claimed in claim 12, further comprising:

connecting a parasitic cancellation shunt network between output terminals of the first peaking amplifier and the second peaking amplifier and a RF ground.

16. The method for manufacturing the Doherty power amplifier as claimed in claim 12, wherein the impedance inverting network connecting the first and the second hybrid integrated matching circuit is configured to prevent leakage of signal from between transistors of the main amplifier and the first and second peaking amplifiers when any of the transistors is turned off, and wherein a characteristic impedance of the impedance inverting network is adjusted to optimize a bandwidth and efficiency peaks of the Doherty power amplifier.

17. The method for manufacturing the Doherty power amplifier as claimed in claim 12, wherein the impedance inverting network connecting the first and the second hybrid integrated matching circuit includes at least one of the following topologies: a quarter wave transformer, a high pass $n^{th}$ order quarter wave transformer, a low pass $n^{th}$ order quarter wave transformer, a low pass n-stage lumped quarter wave transformer, a high pass n-stage lumped quarter wave transformer, a reduced length quarter wave transmission line, a quasi-lumped $n^{th}$ order low pass filter, a quasi-lumped $n^{th}$ order high pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, a quasi-lumped $n^{th}$ order high pass quarter wave transformer, a quasi-lumped high pass Chebyshev transformer, a quasi-lumped high pass Chebyshev quarter wave transformer, quasi-lumped high pass quarter wave stepped impedance transformer and a quasi-lumped high pass quarter wave stepped impedance quarter wave transformer, a combination of low pass and high pass lumped or distributed quarter wave transformer; wherein n is a natural number.

18. The method for manufacturing the Doherty power amplifier as claimed in claim 13, wherein the another impedance inverting network connecting the second and the third hybrid integrated matching circuit is configured to prevent leakage of signal from between transistors of the first and second peaking amplifiers when any of the transistors is turned off, and wherein a characteristic impedance of the another impedance inverting network is adjusted to optimize a bandwidth of the Doherty power amplifier.

19. The method for manufacturing the Doherty power amplifier as claimed in claim 13, wherein the another impedance inverting network connecting the second and the third hybrid integrated matching circuit includes at least one of the following topologies: a quarter wave transformer, a high pass $n^{th}$ order quarter wave transformer, a low pass $n^{th}$ order quarter wave transformer, a low pass n-stage lumped quarter wave transformer, a high pass n-stage lumped quarter wave transformer, a reduced length quarter wave transmission line, a quasi-lumped $n^{th}$ order low pass filter, a quasi-lumped $n^{th}$ order high pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, a quasi-lumped $n^{th}$ order high pass quarter wave transformer, a quasi-lumped high pass Chebyshev transformer, a quasi- lumped high pass Chebyshev quarter wave transformer, quasi-lumped high pass quarter wave stepped impedance transformer and a quasi-lumped high pass quarter wave stepped impedance quarter wave transformer, a combination of low pass and high pass lumped or distributed quarter wave transformer; wherein n is a natural number.

20. The method for manufacturing the Doherty power amplifier as claimed in claim 12, wherein the impedance inverting network of the second hybrid integrated matching circuit is constructed with an impedance inverter with at least one of the following topologies: a low pass n-stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer; wherein n is a natural number.

21. The method for manufacturing the Doherty power amplifier as claimed in claim 13, wherein the impedance inverting network of the third hybrid integrated matching circuit is constructed with an impedance inverter with at least one of the following topologies: a low pass n-stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer; wherein n is a natural number.

*     *     *     *     *